US007964869B2

(12) United States Patent
Muraoka et al.

(10) Patent No.: US 7,964,869 B2
(45) Date of Patent: Jun. 21, 2011

(54) MEMORY ELEMENT, MEMORY APPARATUS, AND SEMICONDUCTOR INTEGRATED CIRCUIT

(75) Inventors: Shunsaku Muraoka, Osaka (JP); Satoru Fujii, Osaka (JP); Satoru Mitani, Osaka (JP); Koichi Osano, Osaka (JP)

(73) Assignee: Panasonic Corporation, Osaka (JP)

( * ) Notice: Subject to any disclaimer, the term of this patent is extended or adjusted under 35 U.S.C. 154(b) by 226 days.

(21) Appl. No.: 12/376,256

(22) PCT Filed: Aug. 17, 2007

(86) PCT No.: PCT/JP2007/066009
§ 371 (c)(1),
(2), (4) Date: Feb. 3, 2009

(87) PCT Pub. No.: WO2008/023637
PCT Pub. Date: Feb. 28, 2008

(65) Prior Publication Data
US 2009/0321709 A1 Dec. 31, 2009

(30) Foreign Application Priority Data

Aug. 25, 2006 (JP) ................................ 2006-229678
Feb. 1, 2007 (JP) ................................ 2007-022726

(51) Int. Cl.
*H01L 29/10* (2006.01)
(52) U.S. Cl. ... 257/43; 257/537; 257/776; 257/E29.081; 257/E45.003
(58) Field of Classification Search .................... 257/43, 257/536, 537, 776, E27.07, E27.081, E27.084, 257/E45.002, E45.003
See application file for complete search history.

(56) References Cited

U.S. PATENT DOCUMENTS

| 6,204,139 | B1 | 3/2001 | Liu et al. | |
|---|---|---|---|---|
| 7,525,832 | B2* | 4/2009 | Muraoka et al. | 365/148 |
| 7,577,022 | B2* | 8/2009 | Muraoka et al. | 365/159 |
| 7,692,178 | B2* | 4/2010 | Kawashima et al. | 257/5 |
| 7,787,280 | B2* | 8/2010 | Mitani et al. | 365/148 |
| 2006/0108625 | A1* | 5/2006 | Lee et al. | 257/310 |
| 2007/0196696 | A1* | 8/2007 | Osano et al. | 428/811.4 |
| 2007/0240995 | A1* | 10/2007 | Odagawa et al. | 205/183 |
| 2007/0267621 | A1* | 11/2007 | Ufert | 257/4 |

(Continued)

FOREIGN PATENT DOCUMENTS

JP 2004-342843 12/2004

(Continued)

OTHER PUBLICATIONS

Seo, S., et al., "Conductivity switching characteristics and reset currents in NiO films", Applied Physics Letters, 2005, pp. 093509-1-093509-3, vol. 86, American Institute of Physics.

*Primary Examiner* — Matthew Landau
*Assistant Examiner* — Joseph C Nicely
(74) *Attorney, Agent, or Firm* — McDermott Will & Emery LLP

(57) ABSTRACT

A memory element comprises a first electrode, a second electrode, and a resistance variable film 2 which is disposed between the first and second electrodes to be connected to the first and second electrodes, a resistance value of the resistance variable film 2 varying based on voltage applied between the first and second electrodes, the resistance variable film 2 includes a layer 2a made of $Fe_3O_4$ and a layer 2b made of $Fe_2O_3$ or a spinel structure oxide which is expressed as $MFe_2O_4$ (M: metal element except for Fe); and the layer 2a made of $Fe_3O_4$ is thicker than the layer 2b made of $Fe_2O_3$ or the spinel structure oxide.

21 Claims, 27 Drawing Sheets

U.S. PATENT DOCUMENTS

| | | | |
|---|---|---|---|
| 2008/0011996 A1* | 1/2008 | Bednorz et al. | 257/2 |
| 2008/0299680 A1* | 12/2008 | Anthony et al. | 438/3 |
| 2009/0067214 A1* | 3/2009 | Mitani et al. | 365/148 |
| 2009/0109581 A1* | 4/2009 | Fukuzawa et al. | 360/324.12 |
| 2009/0286350 A1* | 11/2009 | Lam et al. | 438/102 |
| 2010/0171091 A1* | 7/2010 | Daley | 257/5 |
| 2010/0182821 A1* | 7/2010 | Muraoka et al. | 365/148 |
| 2010/0187492 A1* | 7/2010 | Lee | 257/3 |
| 2010/0200852 A1* | 8/2010 | Kawashima et al. | 257/43 |
| 2010/0219391 A1* | 9/2010 | Campbell et al. | 257/2 |
| 2010/0225438 A1* | 9/2010 | Wei et al. | 338/20 |

FOREIGN PATENT DOCUMENTS

| | | |
|---|---|---|
| JP | 2004-349689 | 12/2004 |
| JP | 2004-363604 | 12/2004 |
| JP | 2005-317976 | 11/2005 |
| JP | 2006-040946 | 2/2006 |
| JP | 2006-080259 | 3/2006 |
| WO | WO 2005/101420 A1 | 10/2005 |
| WO | WO 2006/109622 A1 | 10/2006 |
| WO | WO 2007/086325 A1 | 8/2007 |
| WO | WO 2007/102483 A1 | 9/2007 |

* cited by examiner (a)

(b)

MEMORY ELEMENT, MEMORY APPARATUS, AND SEMICONDUCTOR INTEGRATED CIRCUIT

RELATED APPLICATIONS

This application is the U.S. National Phase under 35 U.S.C. §371 of International Application No. PCT/JP2007/066009, filed on Aug. 17, 2007, which in turn claims the benefit of Japanese Application No. 2006-229678 filed on Aug. 25, 2006 and Japanese Application No. 2007-022726 filed on Feb. 1, 2007, the disclosures of which Applications are incorporated by reference herein.

TECHNICAL FIELD

The present invention relates to a memory element, a memory apparatus, and a semiconductor integrated circuit (hereinafter referred to as "memory element and the like"). More particularly, the present invention relates to a resistance variable memory element and the like whose resistance value varies according to an applied voltage.

BACKGROUND ART

With the advancement of digital technologies in electronic devices, demands for an increase in a capacity of a nonvolatile memory element, reduction in a writing power in the element, reduction in write/readout time of the element, and a longer life of the element have been increasing, for storing data such as images. It is said that, in response to these demands, miniaturization of a FLASH memory using the existing floating gate has a limitation. To meet the demands, nonvolatile memory elements using perovskite materials (e.g., Pr(1-X)CaXMnO3 (PCMO), LaSrMnO 3 (LSMO), GdBaCoXOY (GBCO), etc) have been proposed (Patent document 1). In this technique, the perovskite material is applied with predetermined pulse voltages of different polarities (or unipolar pulse voltages having different pulse voltages) to increase or decrease its resistance value, and utilizing the resulting varied resistance value, the data are converted into the resistance value of the element to be stored.

There are also nonvolatile memory elements which utilize an event that resistance values of transition metal oxide films ($NiO$, $V_2O_5$, $ZnO$, $Nb_2O_5$, $TiO_2$, $WO_3$, or $CoO$) are varied by application of the pulse voltages (see Patent document 2).

There are also nonvolatile memory elements in which an amorphous oxide (oxide containing one or more elements selected from, for example, Ti, V, Fe, Co, Y, Zr, Nb, Mo, Hf, Ta, W, Ge, and Si) is provided with an Ag electrode or a Cu electrode and Ag or Cu which is an electrode material is ionized to diffuse into a thin film by application of a voltage so that the resistance value of the amorphous oxide is varied (see Patent document 3). By using these resistance variable materials as memory cells, and combining them with transistors for selecting individual memory cells, an operation of the nonvolatile memory element is attained.

Moreover, there are proposed nonvolatile memory elements using a spinel structure oxide which is a typical resistance variable thin film material (see patent document 4). As described later, a problem arises when the resistance value of the resistance variable film is low. To solve the problem, there is proposed a structure in which a high-resistance layer is stacked on a low-resistance resistance variable film (see Patent document 5 and Non-patent document 1).

Patent Document 1: U.S. Pat. No. 6,204,139 Specification
Patent document 2: Japanese Laid-Open Patent Application Publication No. 2004-363604
Patent document 3: Japanese Laid-Open Patent Application Publication No. 2004-342843
Patent document 4: Japanese Laid-Open Patent Application Publication No. 2006-80259
Patent document 5: Japanese Laid-Open Patent Application Publication No. 2005-317976
Non-patent document 1: Applied Physics Letters 2005, 86th edition, 093509 page

DISCLOSURE OF THE INVENTION

Problems to be Solved by the Invention

However, in cases where the high-temperature super conduction material or the oxide having the perovskite structure such as CMR material disclosed in Patent document 1 is used as the material for the resistance variable thin film, or the transition metal oxide material disclosed in patent document 2 is used as the material for the resistance variable thin film, resistance varying characteristics of respective of a plurality of memory elements are sometimes not equal to each other and thus are inconstant, even though the memory elements are manufactured under the same manufacturing conditions. For example, even when the same pulse voltage is applied to the memory elements manufactured under the same conditions, they in some cases show different resistance values (different resistance varying characteristics). That is, reproducibility (rate with which the element having the same characteristic can be manufactured in repetition) of the memory element is low, leading to a low yield.

In the nonvolatile memory element disclosed in Patent document 3 (nonvolatile memory element comprising the amorphous oxide material and the Ag or Cu electrode), since the resistance variable thin film has the amorphous structure, characteristic change may occur due to crystallization of the thin film after a long time use.

In a case where the resistance variable film made of $Fe_3O_4$ is used for the nonvolatile memory element disclosed in Patent document 4, its resistance varying characteristic is excellent but a large driving current flows in the resistance variable film when it is applied with a voltage, because the resistance variable film has a low resistance. Consequently, a problem that the resistance variable film, a contact with the electrodes sandwiching the resistance variable film, wires and others may be damaged arises. In another case where the resistance variable film which has a low resistance value is applied with a forming voltage, a problem that a sufficient voltage cannot be applied to the resistance variable film to enable the "forming," due to a relation with a magnitude of a parasitic wire resistance arises. These problems are serious from the view point of obtaining reliability of the resistance variable film.

In another case where the high-resistance layer is stacked on the resistance variable film having the low-resistance value as disclosed in Patent document 5 and Non-patent document 1, a new problem that a ratio between the low-resistance value and the high-resistance value of the resistance variable film, i.e., a resistance variation rate decreases arises.

The present invention has been made in view of the circumstances, and an object of the present invention is to provide a resistance variable memory element and the like which are capable of suppressing the generation of the inconstant resistance values (resistance varying characteristic) of the resistance variable film to improve reproducibility of the resistance values and to provide a high manufacturing yield, and of enduring a long-time use.

Another object of the present invention is to provide a resistance variable memory element and the like which include a resistance variable film having proper resistance values for attaining high reliability.

A further object of the present invention is to provide a memory element and the like which have a layered structure to enable the resistance variable film to retain a proper resistance variation rate and to vary resistance at a high speed.

Means for Solving the Problems

It was found out that in the memory element including the layer made of $Fe_3O_4$ (magnetite) as a major layer in the resistance variable film, the generation of the inconstant resistance values (resistance varying characteristics) of the resistance variable film can be suppressed as compared to the conventional resistance variable film, by forming at least one layer which is either the layer made of $Fe_2O_3$ or the spinel structure oxide (M: metal element except for Fe) which is expressed as $MFe_2O_4$ is formed to be included in the resistance variable film. In addition, it was found that with such a structure, the resistance variable film has proper resistance values, as a result, a proper current which does not impart damage flows, and a proper voltage is applied during application of a forming voltage, thereby improving reliability. Furthermore, it was found out that since an internal stress in the respective resistance layers due to a difference in a crystalline structure can be reduced by providing the layer structure, the resistance variable film is capable of maintaining a large resistance variation rate and of resistance variation at a high-speed.

The present invention has been made based on the above finding, and a memory element of the present invention comprises a first electrode; a second electrode; and a resistance variable film which is disposed between the first and second electrodes to be connected to the first and second electrodes, a resistance value of the resistance variable film varying based on a voltage applied between the first and second electrodes; wherein the resistance variable film includes a layer made of $Fe_3O_4$ and a layer made of $Fe_2O_3$ or a spinel structure oxide which is expressed as $MFe_2O_4$ (M: metal element except for Fe); and wherein the layer made of $Fe_3O_4$ is thicker than the layer made of $Fe_2O_3$ or the spinel structure oxide.

Thereby, reproducibility of the resistance value of the memory element is improved, and as a result, the memory element can be manufactured with a high yield.

The resistance variable film has a polycrystalline structure rather than an amorphous structure. For this reason, the memory element of the present invention is less likely to change a characteristic even after a long-time use as compared to the conventional memory element.

A memory element of the present invention comprises a memory array including a semiconductor substrate; a plurality of first electrode wires formed on the semiconductor substrate to extend in parallel with each other: a plurality of second electrode wires formed above the plurality of first electrode wires so as to extend in parallel with each other within a plane parallel to a main surface of the semiconductor substrate and so as to three-dimensionally cross the plurality of first electrode wires; and nonvolatile memory elements provided to respectively correspond to three-dimensional cross points between the plurality of first electrode wires and the plurality of second electrode wires; wherein each of the nonvolatile memory elements includes a resistance variable film which is disposed between the first and second electrode wires, a resistance value of the resistance variable film varying based on a voltage applied between the first and second electrode wires; wherein the resistance variable film includes a layer made of $Fe_3O_4$ and a layer made of $Fe_2O_3$ or a spinel structure oxide which is expressed as $MFe_2O_4$ (M: metal element except for Fe); and wherein the layer made of $Fe_3O_4$ is thicker than the layer made of $Fe_2O_3$ or the spinel structure oxide.

In such a configuration, a so-called cross-point type memory element is attained.

The layer made of $Fe_2O_3$ or the spinel structure oxide may be formed at least either in the vicinity of an interface between the resistance variable film and the first electrode or in the vicinity of an interface between the resistance variable film and the second electrode.

It is preferable that the resistance variable film has a thickness that is not smaller than 1 nm and not larger than 200 nm.

Thereby, when lithography is used in a patterning process for the resistance variable film, the resistance variable thin film is easier to process. In addition, a voltage value of a pulse voltage for varying the resistance value of the memory element is suitably made lower.

If the layer made of $Fe_2O_3$ or the spinel structure oxide has a thickness that is larger than 20% of a thickness of the resistance variable film, it is difficult to vary the resistance value of the memory element by application of a pulse voltage. Therefore, it is preferable that the layer made of $Fe_2O_3$ has a thickness that is not larger than 20% of the thickness of the resistance variable film.

It is preferable that the spinel structure oxide is an oxide expressed as $MFe_2O_4$ and M of the spinel structure oxide is at least one element selected from a group consisting of Mn, Co, Ni, Cu, and Zn.

At least one of the first and second electrodes may be made of a material selected from a group consisting of Ag, Au, Pt, Ru, $RuO_2$, Ir, $IrO_2$, TiO, TiN, and TiAlN.

These materials have stable properties against heating during a manufacturing process of the memory element and are therefore suitable as an electrode material.

The memory element may be applied with a predetermined pulse voltage between the first electrode and the second electrode to cause 1-bit or multi-bit data to be stored therein according to a variation in the resistance value.

The memory element may be applied with a predetermined voltage between the first electrode and the second electrode to cause 1-bit or multi-bit data to be reproduced so as to correspond to a current value according to a variation in the resistance value.

A memory apparatus of the present invention comprises a plurality of word lines extending in a first direction; a plurality of bit lines extending in a second direction so as to cross the word lines; a plurality of plate lines extending in the second direction so as to respectively correspond to the plurality of bit lines; a plurality of transistors provided to respectively correspond to intersections between the word lines and the bit lines; a plurality of memory elements respectively corresponding to the plurality of transistors; a word line driving portion which is connected to the plurality of word lines and is configured to control voltage application to the word lines; and a bit line/plate line driving portion connected to the plurality of bit lines and to the plurality of plate lines and is configured to control voltage application to the bit lines and to the plate lines; wherein one of the plurality of transistors and one of the plurality of memory elements which is associated with the one of the plurality of transistors are connected in series between one of the plurality of bit lines and one of the plurality of plate lines which is associated with the one of the plurality of bit lines; wherein a gate of the one of the plurality of transistors is connected to one of the plurality of word lines and a drain and source of the one of the plurality of transistors is connected to the one of the bit lines and to the one of the memory elements; wherein the one of the memory elements includes a first electrode connected to the one of the plurality of transistors, a second electrode connected to the one of the plate lines, and a resistance variable film connected to the first electrode and to the second electrode; and wherein the resistance variable film includes a layer made of $Fe_3O_4$ and a layer made of $Fe_2O_3$ or a spinel structure oxide which is expressed as $MFe_2O_4$ (M: metal element except for Fe); and wherein the layer made of $Fe_3O_4$ is thicker than the layer made of $Fe_2O_3$ or the spinel structure oxide.

In accordance with the above memory apparatus, the memory array including the memory elements which occupy a large part of the memory apparatus can be manufactured with high precision. Therefore, the memory apparatus can significantly improve a yield as compared to the conventional memory apparatus.

Moreover, the resistance variable film forming memory element has a polycrystalline structure rather than an amorphous structure. For this reason, the memory apparatus of the present invention is capable of maintaining reliability as a memory array even after a long-time use as compared to the conventional memory apparatus.

The word line driving portion may be configured to apply an activation voltage to a word line connected to the gate of the transistor associated with the memory element in which predetermined data is to be stored to cause a drain-source of the transistor to be placed in an electrically conductive state; and the bit line/plate line driving portion may be configured to apply a first pulse voltage to a bit line connected to the transistor associated with the memory element in which the predetermined data is to be stored and to apply a second pulse voltage to a plate line associated with the bit line.

The word line driving portion may be configured to apply an activation voltage to a word line connected to the gate of the transistor associated with the memory element from which prestored predetermined data is to be reproduced to cause a drain-source of the transistor to be placed in an electrically conductive state; and the bit line/plate line driving portion may be configured to apply a first reproducing voltage to a bit line connected to the transistor associated with the memory element from which the predetermined data is to be reproduced and to apply a second reproducing voltage to a plate line associated with the bit line.

A semiconductor integrated circuit of the present invention comprises the above described memory apparatus; and a logic circuit having a storing mode and a reproducing mode and being configured to execute predetermined calculation; wherein the logic circuit is configured to, in the storing mode, control the memory apparatus to cause the memory apparatus to store bit data therein, and is configured to, in the reproducing mode, control the memory apparatus to cause the memory apparatus to reproduce the bit data stored therein.

The semiconductor integrated circuit is configured to suitably enables the memory apparatus with a significantly improved manufacturing yield to store a large volume of data at a high speed.

A semiconductor integrated circuit of the present invention is a circuit comprising the above described memory apparatus; and a processor having a program running mode and a program rewrite mode; wherein the processor is configured to, in the program running mode, run the program stored in the memory apparatus, and is configured to, in the program rewrite mode, rewrite the program stored in the memory apparatus to a program input externally.

In accordance with the semiconductor integrated circuit thus configured, suitably, different functions are attainable (so-called reconfigurable) with one processor (LSI) using the memory apparatus with a significantly improved manufacturing yield.

Foregoing object, other object, features, and advantages of the present invention will be apparent from the following detailed description of the preferred embodiments with reference to accompanying drawings.

EFFECTS OF THE INVENTION

In accordance with the present invention, by suppressing the generation of the inconstant resistance values (resistance varying characteristic) of the resistance variable film, a resistance variable memory element and the like which are capable of improving reproducibility of the resistance values to provide a high manufacturing yield, and of enduring a long-time use, are attainable.

In accordance with the present invention, since the resistance variable film has proper resistance values, a proper current which does not impart damage is flowed in the memory element and a proper voltage is applied to the memory element during forming voltage application, a resistance variable memory element and the like which are capable of improving reliability are attainable.

By forming a layer structure in the resistance variable film, an internal stress in respective resistance layers which would be generated due to difference in crystalline structures, can be reduced. As a result, a memory element and the like which have the resistance variable film capable of retaining a large resistance variation rate and which are capable of resistance variation at a high speed, are attainable.

BRIEF DESCRIPTION OF THE DRAWINGS

FIG. 17 is a view showing a nonvolatile memory element according to Embodiment 2 of the present invention, wherein FIG. 17(a) is a schematic plan view of a configuration of a cross-point type nonvolatile memory element as viewed from a substrate surface, and FIG. 17(b) is a schematic cross-sectional view in the direction of arrows along the line A-A of FIG. 17(a);

Figure 1:
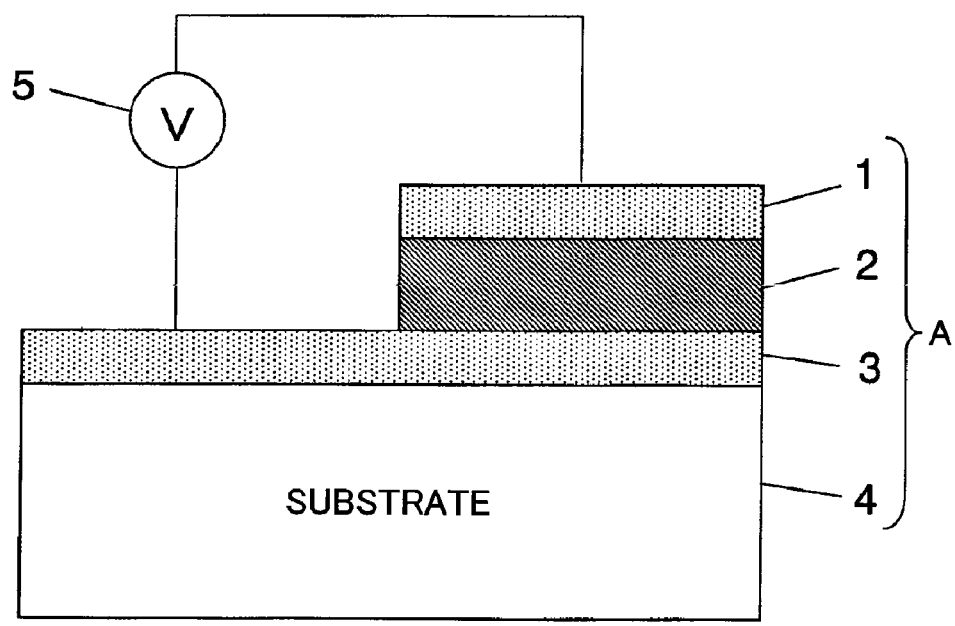
FIG. 1 is a view showing an example of a structure of a memory element (A) of Embodiment 1.

EXPLANATION OF REFERENCE NUMERALS 1 upper electrode
2 resistance variable thin film
2a $Fe_3O_4$ layer
2b $Fe_2O_3$ layer
3 lower electrode
4 substrate
5 electric power supply
101-1, 101-2 terminal
200 memory apparatus
201 memory array
202 address buffer
203 control unit
204 row decoder
205 word line driver
206 column decoder
207 bit line/plate line driver
300 semiconductor integrated circuit
301 logic circuit
400 semiconductor integrated circuit
401 processor
402 interface
320, 331 nonvolatile memory element
321 substrate surface
322, 322a, 322b, 322c, 322d, 322e, 322f, 322g, 322h lower electrode
323, 323a, 323b, 323c, 323d, 323e, 323f, 323d, 323h upper electrode
324 resistance variable film
325 memory portion
326 substrate
327 first interlayer insulating film
328 groove
329 $Fe_3O_4$ layer
330 spinel structure oxide layer
332 second interlayer insulating film
A memory element
MC 211, MC212, MC221, MC222 memory cell
W1, W2 word line
B1, B2 bit line
P1, P2 plate line

BEST MODE FOR CARRYING OUT THE INVENTION

Hereinafter, embodiments of the present invention will be described in detail with reference to the drawings. It should be noted that the same reference numerals are used to identify the same or corresponding parts throughout the drawings, and a description thereof is in some cases omitted.

Embodiment 1

FIG. 1 is a view showing an example of a configuration of a memory element according to this embodiment.

As shown in FIG. 1, a memory element (A) includes a substrate 4, a lower electrode 3 formed on the substrate 4, an upper electrode 1, and a resistance variable thin film 2 sandwiched between the electrodes 1 and 3.

An electric power supply 5 for driving the memory element (A) is configured to apply a predetermined voltage between the upper electrode 1 and the lower electrode 3. When the electric power supply 5 applies a voltage (e.g., pulse voltage) satisfying a predetermined condition, a resistance value of the resistance variable thin film 2 of the memory element (A) increases or decreases. For example, when a pulse voltage larger than a predetermined threshold voltage is applied, the resistance value of the resistance variable thin film 2 of the memory element (A) increases or decreases, whereas when a pulse voltage smaller than the predetermined threshold voltage is applied, the resistance variation of the resistance variable thin film 2 of the memory element (A) is not affected (that is, the resistance value of the resistance variable thin film 2 does not vary).

The materials of the upper electrode 1 and the lower electrode 3 include, for example, Pt (platinum), Ru (ruthenium), Ir (iridium), Ag (silver), Au (gold), $RuO_2$ (ruthenium oxide), $IrO_2$ (iridium oxide), TiO (titanium oxide), TiN (titanium nitride), and TiAlN (titanium aluminum nitride).

Since the resistance variable thin film 2 is usually formed by heating the substrate 4 up to about 300° C., a material having a stable property with respect to heating during a manufacturing process is desirably used as the material for the lower electrode 3 between the resistance variable thin film 2 and the substrate 4. The above mentioned materials meet such a requirement.

The resistance variable thin film 2 of this embodiment is a layer made of $Fe_3O_4$ (magnetite) having a spinel structure (hereinafter referred to as "$Fe_3O_4$ layer") as a major constituent (major layer). To attain an effect of suppressing the generation of the inconstant resistance values as described layer, the resistance variable thin film 2 includes at least either a layer made of $Fe_2O_3$ (hereinafter referred to as "$Fe_2O_3$ layer") as a sub-constituent (sub-layer) or a layer made of a spinel structure oxide expressed as $MFe_2O_4$ (M: metal element except for Fe; hereinafter referred to as "spinel structure oxide layer"). As used herein, "$Fe_3O_4$ layer as a major layer," "$Fe_2O_3$ layer as a sub-layer", and "a spinel structure oxide (M: metal element except for Fe) expressed as $MFe_2O_4$ as a sub-layer" means that the $Fe_2O_3$ layer or the spinel structure oxide layer is formed to be thinner than the $Fe_3O_4$ layer (in other words, $Fe_3O_4$ layer is formed to be thicker than the $Fe_2O_3$ layer or the spinel structure oxide layer.

That is, the resistance variable thin film 2 includes the $Fe_3O_4$ layer and the $Fe_2O_3$ layer or the spinel structure oxide layer, and the $Fe_3O_4$ layer is formed to be thicker than the $Fe_2O_3$ layer or the spinel structure oxide layer. If the thickness of the $Fe_2O_3$ layer or the spinel structure oxide layer is larger than 20% of the thickness of the resistance variable thin film 2, it becomes very difficult to vary the resistance value of the memory element by a pulse voltage. Therefore, it is desired that the thickness of the $Fe_2O_3$ layer or the spinel structure oxide layer be not larger than 20% of the thickness of the resistance variable thin film 2.

In first example, a case where the sub-layer is the $Fe_2O_3$ layer will be described. The present inventors analyzed and confirmed the crystalline structure of the $Fe_2O_3$ layer using an infrared absorption spectrum measurement device (SYSTEM2000 FR-IR made by PERKIN ELMER Co. ltd).

Figure 2:
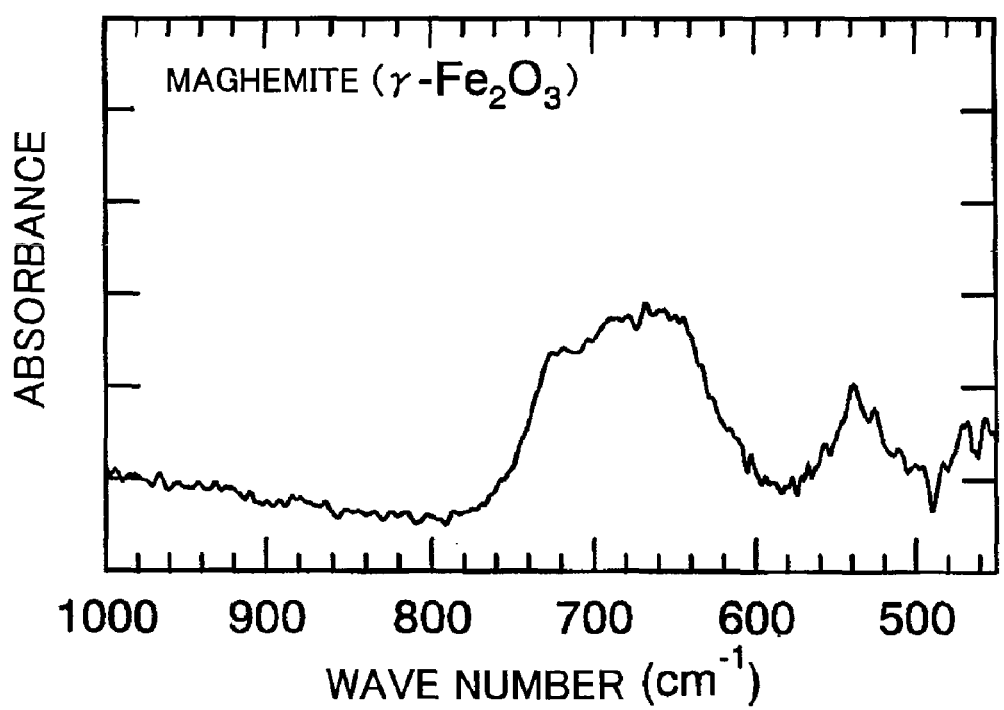
FIG. 2 is a view showing an infrared absorption spectrum curve of a crystalline structure of a $\gamma$-$Fe_2O_3$ (maghemite) layer according to Embodiment 1 with a horizontal axis being a wave number and a vertical axis being absorbance.

FIG. 2 is a view showing an infrared absorption spectrum curve of a crystalline structure of a $\gamma$-$Fe_2O_3$ (maghemite) layer according to this embodiment with a horizontal axis being a wave number and a vertical axis being absorbance.

With reference to FIG. 2, there appears a broad absorbance peak of the infrared absorption spectrum in a range from about 680 $cm^{-1}$ to 730 $cm^{-1}$. From this, it was confirmed that the $Fe_2O_3$ layer as the sub-layer is $\gamma$-$Fe_2O_3$ (maghemite) having the spinel structure.

If the thickness of the resistance variable thin film 2 is set to 1 μm or less, it is possible to well vary the resistance value of the memory element by application of a pulse voltage. Therefore, it is desired that the thickness of the resistance variable thin film 2 be 1 μm or less.

When lithography is used in a pattering process, it is desired that the thickness of the resistance variable thin film 2 be 200 nm or less, because the resistance variable thin film 2 having a smaller thickness is easier to process. In addition, the resistance variable thin film 2 having a smaller thickness is suitable because a voltage value of a pulse voltage for varying the resistance value of the memory element is made lower. Nonetheless, to avoid breakdown occurring during voltage application, it is desired that the thickness of the resistance variable thin film 2 be at least 10 μm or more.

As defined herein, the "$Fe_3O_4$ layer" refers to a portion containing about 100% $Fe_3O_4$, and the "$Fe_2O_3$" layer refers to a portion containing about 100% $Fe_2O_3$. The effect of suppressing the generation of the inconstant resistance values described below is attained so long as the portion containing about 100% $Fe_2O_3$ and the portion containing about 100% $Fe_3O_4$ are present within the resistance variable thin film 2. It is not necessary to clearly define an interface between the $Fe_2O_3$ layer and the $Fe_3O_4$ layer, and a region where $Fe_2O_3$ and $Fe_3O_4$ coexist may be present at the interface.

Subsequently, the effect attained by forming the resistance variable thin film 2 to include at least one $Fe_2O_3$ layer will be described, by way of example.

The memory element (A) using the resistance thin film 2 of this embodiment was manufactured experimentally, and the memory element (B) using the conventional resistance variable thin film was manufactured experimentally as Comparative example.

Hereinafter, the structure, manufacture, and characteristic of each of the memory elements (A) and (B) will be described sequentially.

<Memory Element (A)>

Figure 3:
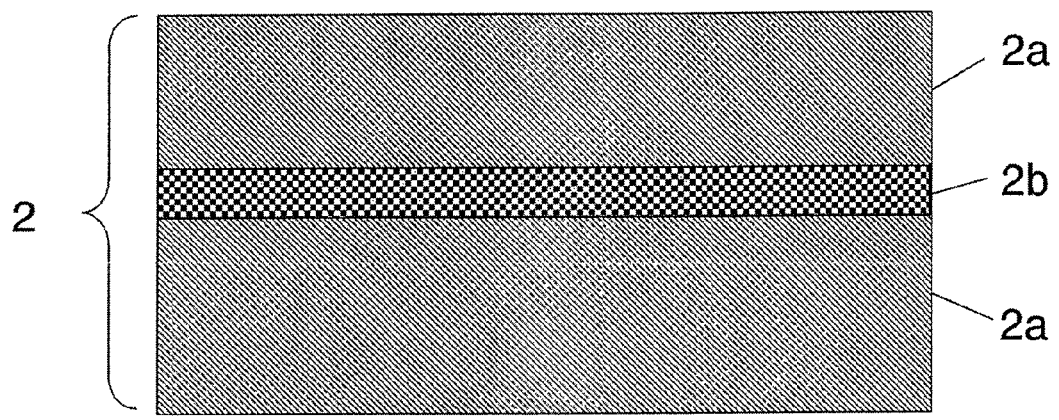
FIG. 3 is a view showing an example of a layer structure of a resistance variable thin film of the memory element (A) according to Embodiment 1.

FIG. 3 is a view showing an example of the structure of the resistance variable thin film of the memory element according to this embodiment.

As shown in FIG. 3, the resistance variable thin film 2 of the memory element (A) includes a $Fe_3O_4$ layer 2a which is a major layer and a $Fe_2O_3$ layer 2b which is a sub-layer inside the layer 2a.

If a total thickness of the resistance variable thin film 2 is 100 nm, then the thickness of the $Fe_2O_3$ layer 2b is set to 10 nm. Therefore, the $Fe_3O_4$ layer 2a in the resistance variable thin film 2 is formed to have a thickness of 90 nm in total.

Subsequently, an example of a manufacturing method of the resistance variable thin film 2 of the memory element (A) will be described.

As can be seen from FIG. 1, the lower electrode 3 made of Pt and having a thickness of 0.2 μm is formed on a substrate 4 by a sputtering process.

Subsequently, by a sputtering process using $Fe_3O_4$ and $Fe_2O_3$ as target materials, the resistance variable thin film 2 having specification described below is formed on the lower electrode 3. To be specific, the resistance variable thin film 2 is, as shown in FIG. 3, formed in such a manner that the $Fe_3O_4$ layer 2a having a thickness of about 50 nm is initially formed, the $Fe_2O_3$ layer 2b having a thickness of about 10 nm is formed thereon, and the $Fe_3O_4$ layer 2a having a thickness of about 40 nm is formed again thereon. The resistance variable thin film 2 having a thickness of about 100 nm in total is formed.

Then, the upper electrode 1 made of Pt and having a thickness of 0.2 μm is formed on the resistance variable thin film 2 by a sputtering process.

In the manner as described above, the resistance variable thin film 2 including the $Fe_3O_4$ layer 2a which is the major layer and the $Fe_2O_3$ layer 2b which is the sub-layer inside the $Fe_3O_4$ layer 2a was attained, and thus the memory element (A) was manufactured.

Next, two kinds of pulse voltages (positive pulse voltage and negative pulse voltage) were alternately applied to the above described memory element (A), and the resistance value of the memory element (A) was measured every time the pulse voltage was applied. The positive pulse voltage is a pulse voltage with which the upper electrode 1 is made "positive" with respect to the lower electrode 3. In this embodiment, the positive pulse voltage has a voltage value of "+2V" and has a pulse width of "100 nsec." The negative pulse voltage is a pulse voltage with which the upper electrode 1 is made "negative" with respect to the lower electrode 3. In this embodiment, the negative pulse voltage has a voltage value of "−2V" and has a pulse width of "100 nscec." Also, in this embodiment, a measurement voltage (voltage which does not affect resistance variation in the memory element, herein, "05V") is applied between the upper electrode 1 and the lower electrode 3, to obtain the resistance values of the memory element. That is, the resistance value of the memory element is calculated based on the voltage value of the measurement voltage and a current value of a current flowing during application of the measurement voltage.

Figure 4:
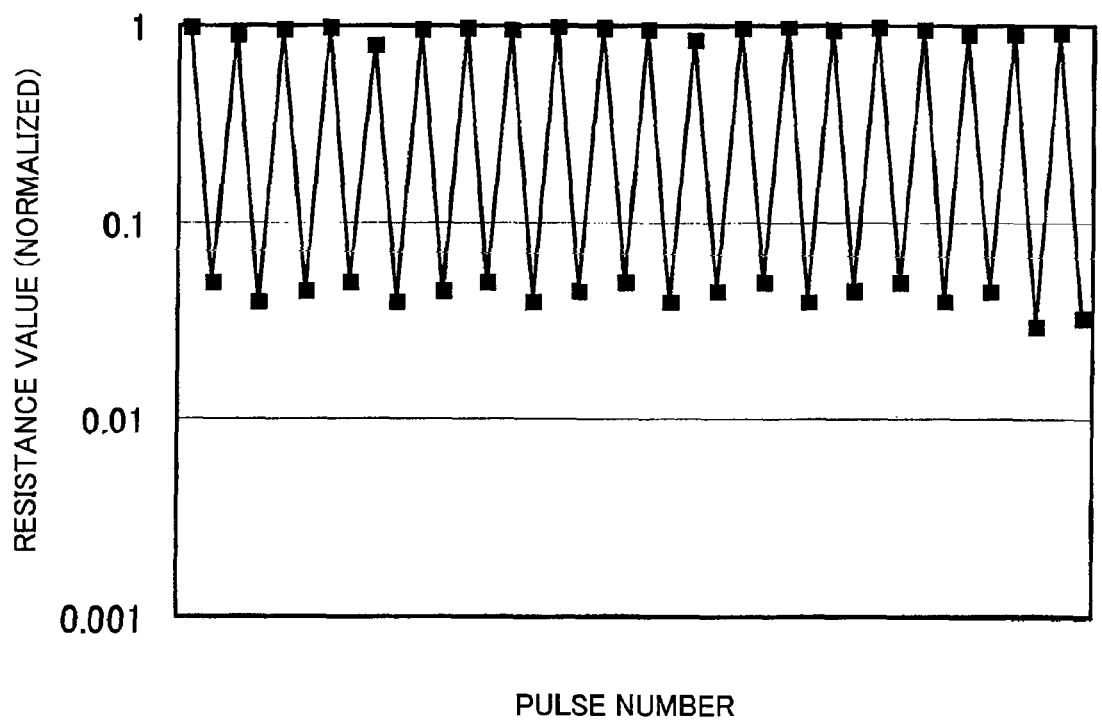
FIG. 4 is a view showing a measurement result for verifying a resistance value variation difference amount in the memory element (A)

FIG. 4 is a view showing a measurement result for verifying a resistance value variation difference amount in the memory element (A).

As can be seen from FIG. 4, the resistance value of the memory element (A) decreases by application of the positive pulse voltage and increases by application of the negative pulse voltage. Since the two kinds of pulse voltages are alternately applied in this embodiment, the resistance of the memory element (A) periodically changes in such a manner that the memory element (A) changes from a high-resistance state (state in which the memory element has a higher resistance value than that of the other state) to a low-resistance state (state in which the memory element has a lower resistance value than that of the other state) by application of the positive pulse voltage and changes from the low-resistance state to the high-resistance state by application of the negative pulse voltage as shown in FIG. 4. In general, there is a tendency that the resistance values are not constant in an initial stage after start of the measurement, but FIG. 4 shows data indicating that resistance value variation is substantially constant with respect to repeated pulse voltage application. It should be noted that the resistance values of the memory element shown in FIG. 4 are normalized using the largest resistance value detected in this measurement (hereinafter referred to as "largest resistance value"). The largest resistance value of the memory element (A) was "approximately 20 kΩ.

<Memory Element (B) as Comparative Example>

A resistance variable thin film of the memory element (B) as Comparative example of Memory Element (A) includes a single $Fe_3O_4$ layer.

Subsequently, an example of a manufacturing method of the resistance variable thin film of the memory element (B) will be described.

The lower electrode made of Pt and having a thickness of 0.2 μm is formed on the substrate 4 (see FIG. 1) by a sputtering process. Then, by a sputtering process using $Fe_3O_4$ as a target material, the single $Fe_3O_4$ layer is formed on the lower electrode 3 to have a thickness of 0.1 μm (100 nm). Then, the upper electrode 1 made of Pt and having a thickness of 0.2μm is formed on the resistance variable thin film 2. Thus, the memory element (B) is manufactured.

Next, as in the case of the memory element (A), two kinds of pulse voltages (positive pulse voltage and negative pulse voltage) were alternately applied to the above described memory element (B), and the resistance value of the memory element (B) was measured every time the pulse voltage was applied.

Figure 5:
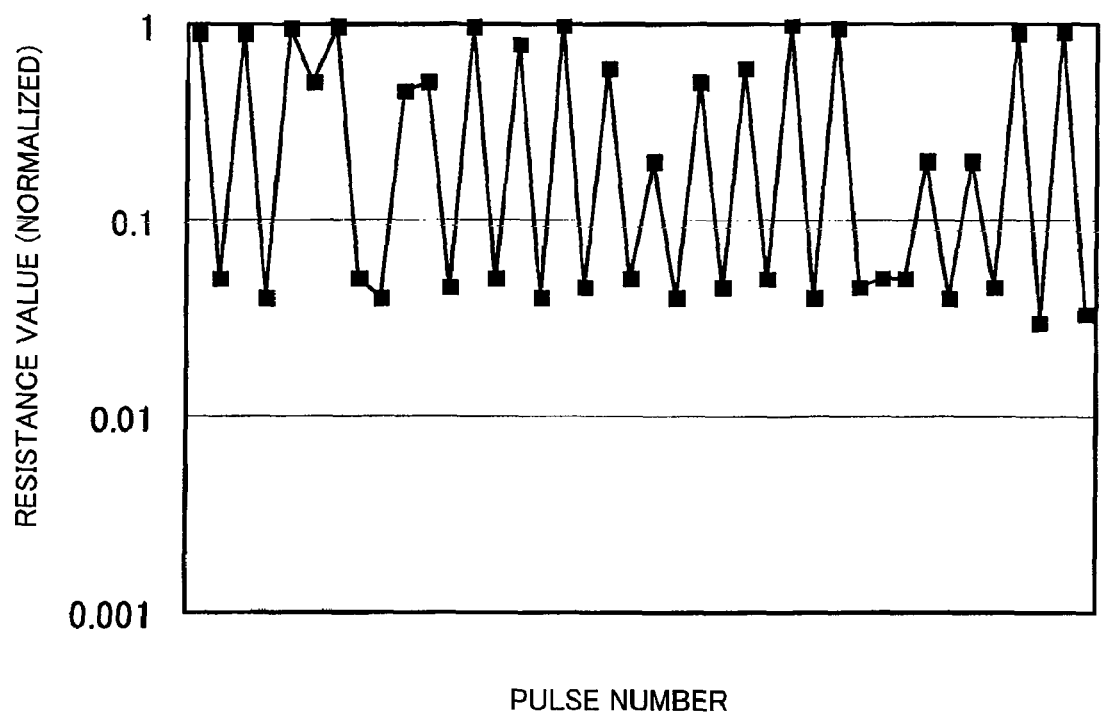
FIG. 5 is a view showing a measurement result for verifying a resistance value variation difference amount in a memory element (B)

FIG. 5 is a view showing a measurement result for verifying a resistance value variation difference amount in the memory element (B).

FIG. 5 shows that the resistance value of the memory element (B) decreases by application of the positive pulse voltage and increases by application of the negative pulse voltage, similarly to the memory element (A). However, as can be seen from FIG. 5, the varied resistance values of the memory element (B) are not constant, and are significantly inconstant, as compared to the resistance values of the memory element (A). Since the resistance values of the memory element (B) are not constant when the pulse voltage is applied to the memory element (B) in repetition, the memory element (B) cannot be used for the memory element capable of stably operation. It should be noted that the resistance values of the memory element shown in FIG. 5 are normalized using the largest resistance value. The largest resistance value of the memory element (A) was "approximately 1.2 kΩ."

Subsequently, a result of verification that the generation of statistical inconstant resistances in the memory element (A) are suppressed as compared to the generation of statistical inconstant resistances in the memory element (B), by manufacturing a number of memory elements (A) and a number of memory elements (B) will be described.

In this embodiment, ten substrates each formed with the memory elements (A) and ten substrates each formed with the memory elements (B) under the same film forming conditions are produced experimentally. One substrate is provided with a number of memory elements (A) or a number of memory elements (B), and five memory elements (A) or five memory elements (B) are selected at random for each individual substrate. For the selected memory elements (A) and the selected memory elements (B), the experiment similar to the above was conducted to measure the resistance values.

To be specific, two kinds of pulse voltages are applied alternately 40 times in total to each memory element (A) and each memory element (B) to measure 40 resistance values for each memory element (A) and each memory element (B). Such measurement was carried out for all of the 50 memory elements (A) and all of the 50 memory elements (B). As a result, measurement data (resistance value) which are 2000 in total number were obtained for each memory element (A) and each memory element (B).

Figure 6:
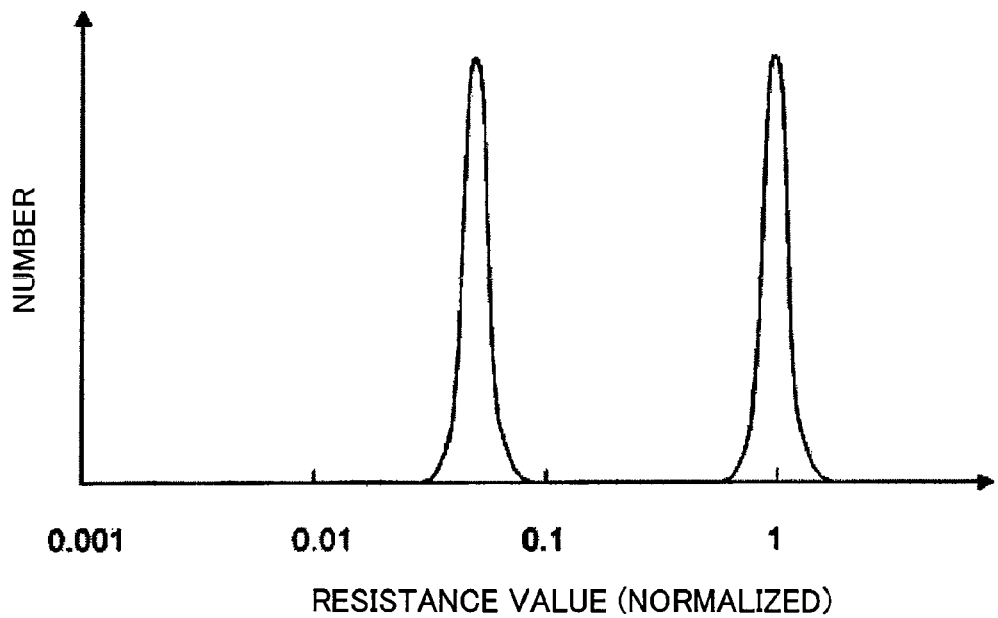
FIG. 6 is a view showing a distribution result of statistical inconstant resistance values of the memory element (A)
Figure 7:
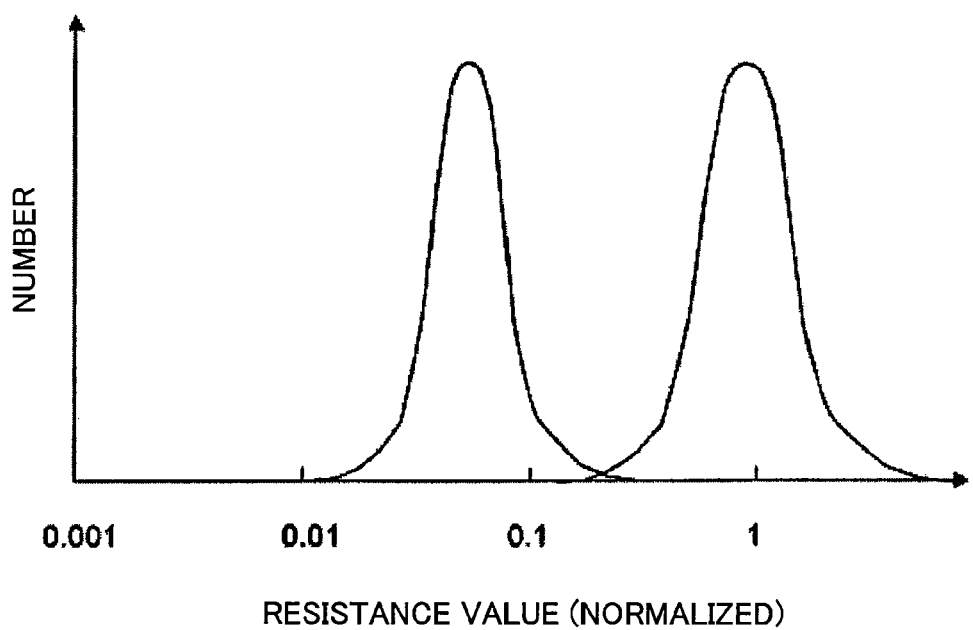
FIG. 7 is a view showing a distribution result of statistical inconstant resistance values of the memory element (B)

FIG. 6 is a view showing a distribution result of statistical inconstant resistance values of the memory element (A). FIG. 7 is a view showing a distribution result of statistical inconstant resistance values of the memory element (B). It should be noted that in FIGS. 6 and 7, the respective measurement data (resistance values) are normalized so that an average value of the resistance values concentrating on the high-resistance state is "1."

As can be seen from comparison between FIGS. 6 and 7, the statistical inconstant resistance values of the memory element (A) are less than the statistical inconstant resistance values of the memory element (B), and the measurement data (resistance value) of the memory element (A) concentrate on specific resistance values (two resistance values in this embodiment).

From the above described verification result, the memory element (A) of this embodiment is capable of suppressing the generation of the inconstant resistance values as compared to the conventional memory element (B). For this reason, the memory element (A) attains stable storing and reproduction characteristics. In addition, the reproducibility of the resistance values of the memory element (A) increases. As a result, a defective rate due to the generation of the inconstant resistance values in the memory element (A) can be reduced, and thus the memory element (A) can be manufactured with a high yield.

Subsequently, an example of the operation performed in a case where the memory element (A) of this embodiment is used as a memory will be described with reference to the drawings.

First, an example of a circuit for causing the memory element (A) to operate will be described.

<Circuit Configuration>

Figure 8:
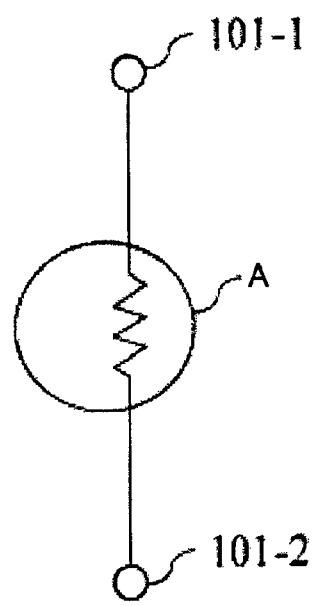
FIG. 8 is a view showing an example of a configuration of a circuit for causing the memory element of Embodiment 1 to operate.

FIG. 8 is a view showing an example of the circuit for causing the memory element of this embodiment to operate.

Here it is assumed that the memory element (A) is used as the memory and is configured to perform 1-bit data processing.

In description below, it is assumed that the resistance value of the memory element (A) is initialized to have a high-resistance value, and an event that the resistance value of the memory element (A) is a value of the "high-resistance" is allocated to "0," whereas an event that the resistance value of the memory element (A) is a value of the "low-resistance" is allocated to "1."

As shown in FIG. 8, the upper electrode 1 (see FIG. 1) of the memory element (A) is connected to the terminal 101-1, while the lower electrode 3 (see FIG. 1) of the memory element (A) is connected to the terminal 101-2.

Figure 9:
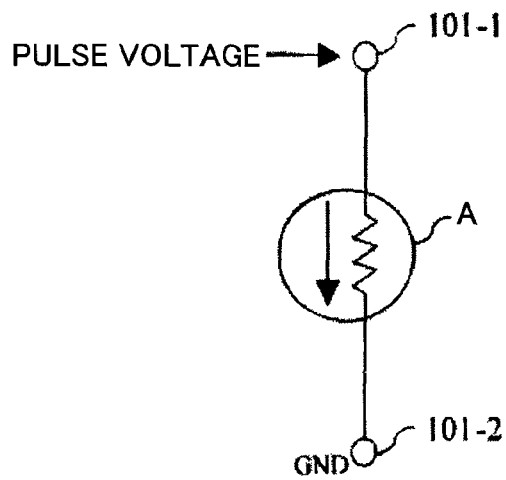
FIG. 9 is a view showing an operation of the memory element of Embodiment 1 which occurs when storing data.
Figure 9:
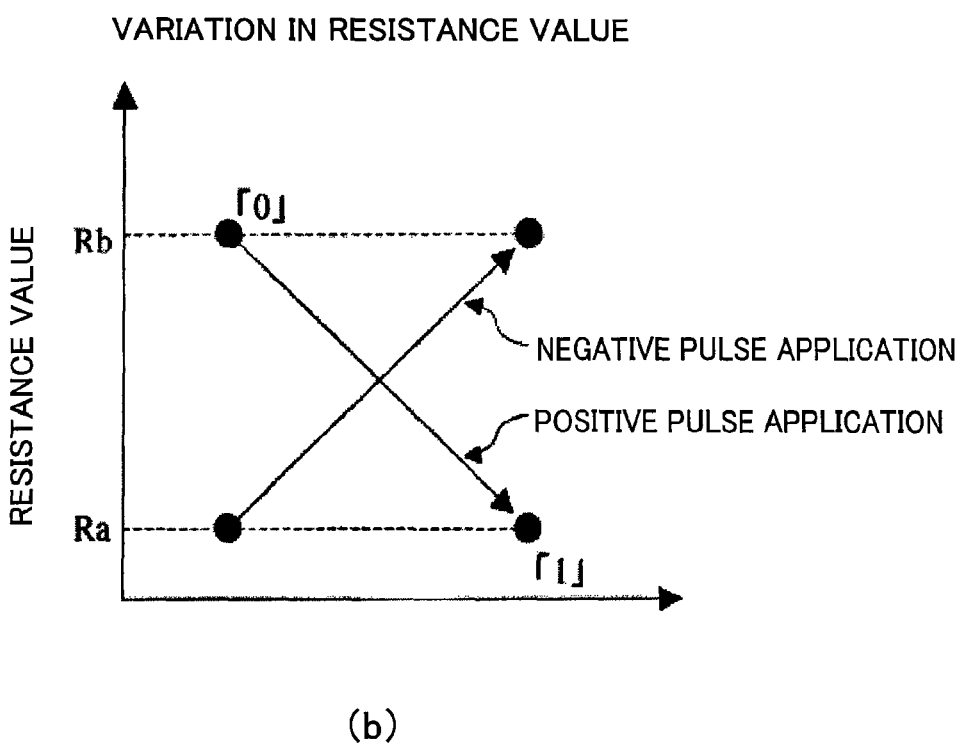

FIG. 9 is a view showing the operation of the memory element of this embodiment which occurs when storing data.

The terminal 101-2 in FIG. 9(*a*) is electrically grounded (GND). When a pulse voltage for storing which is not smaller than a predetermined threshold voltage and has a positive polarity (hereinafter referred to as "positive pulse") is applied to the terminal 101-1 in FIG. 9(*a*) relative to the terminal 101-2 in the memory element (A), the resistance value of the memory element (A) decreases from a high-resistance value "Rb" to a low-resistance value "Ra" as shown in FIG. 9(*b*).

On the other hand, when a pulse voltage for storing which is not smaller than a predetermined threshold voltage and has a negative polarity (hereinafter referred to as "negative pulse") is applied to the terminal 101-1 relative to the terminal 101-2 in the memory element (A) in FIG. 9(*a*), the resistance value of the memory element (A) decreases from the low-resistance value "Ra" to the high-resistance value "Rb." To be specific, by applying the pulse voltage to the memory element (A) so that a current flows in a direction indicated by an arrow shown in FIG. 9(*a*), the resistance value of the memory element (A) decreases, whereas by applying the pulse voltage to the memory element (A) so that a current flows in a direction opposite to the direction indicated by the arrow shown in FIG. 9(*a*), the resistance value of the memory element (A) increases.

Figure 10:
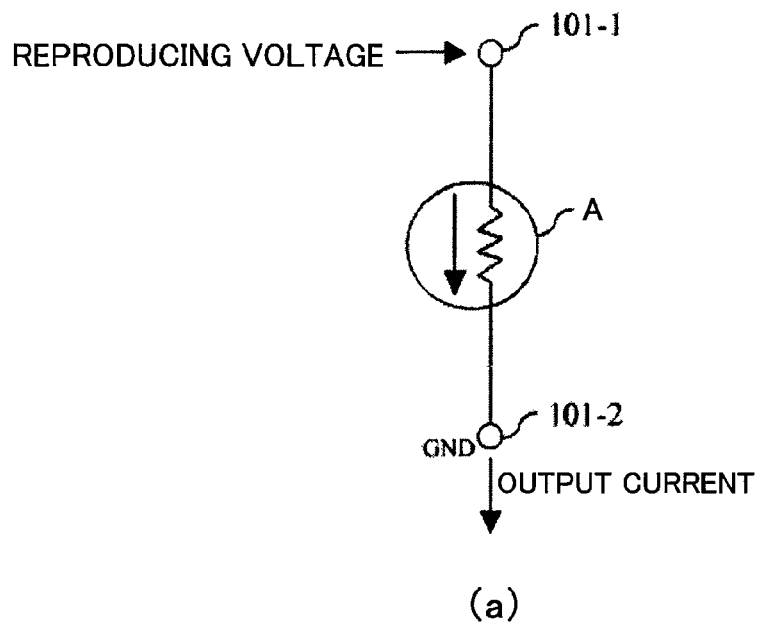
FIG. 10 is a view showing an operation of the memory element of Embodiment 1 which occurs when reproducing data.
Figure 10:
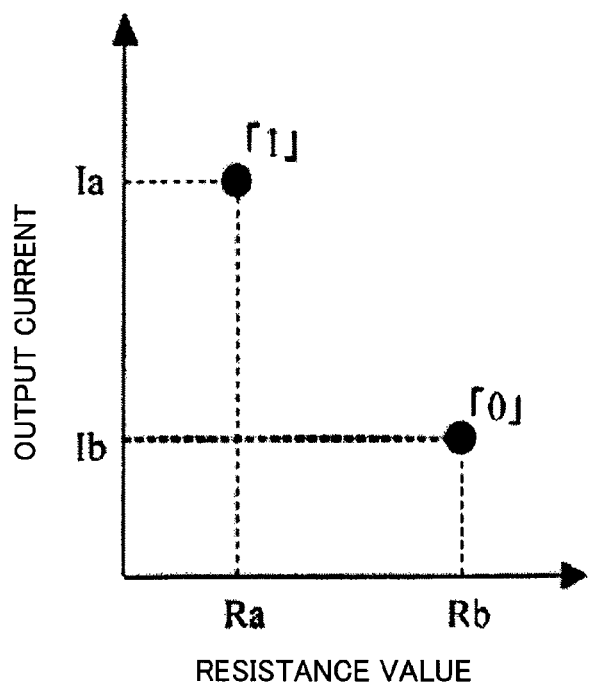

FIG. 10 is a view showing the operation of the memory element of this embodiment which occurs when reproducing data.

The terminal 101-2 in FIG. 10(*a*) is electrically grounded (GND). When a voltage (reproducing voltage) which is smaller than a predetermined threshold voltage and does not affect variation in the resistance value of the memory element (A) is applied to the terminal 101-1 in FIG. 10(*a*) relative to the terminal 101-2, an output current flows according to the resistance value of the memory element (A). That is, as shown in FIG. 10(*b*), when the resistance value of the memory element (A) is the low-resistance value "Ra," an output current having a current value "Ia" flows, whereas when the resistance value of the memory element (A) is the high-resistance value "Rb," an output current having a current value "Ib" flows.

Subsequently, a storing operation, a reset operation, and a reproducing operation of the memory element (A) will be described in detail with reference to the drawings.

[Storing]

When the 1-bit data indicating "1" is written to (stored in) the memory element (A), the terminal 101-2 shown in FIG. 9(*a*) is electrically grounded, and a positive pulse for storing is applied to the terminal 101-1. The voltage value of the pulse voltage is set to, for example, "+2V," and the pulse width thereof is set to, for example, "100 nsec." Since the positive pulse is applied to the memory element (A), the resistance value of the memory element (A) is turned to a low-resistance state corresponding to "1." In this way, the memory element (A) can store 1-bit data indicating "1."

[Reset]

When the memory element (A) is reset to an initial "0" state, the terminal 101-2 shown in FIG. 9(*a*) is electrically grounded and a negative pulse for reset is applied to the terminal 101-1. The voltage value of the pulse voltage is set to, for example, "−2V," and the pulse width thereof is set to, for example, "100 nsec." Since the negative pulse is applied to the memory element (A), the resistance value of the memory element (A) is returned to a high-resistance state corresponding to "0." In this way, the stored data in the memory element (A) is reset to the initial state "0."

[Reproduction]

When the data of the memory element (A) is reproduced, the terminal 101-2 shown in FIG. 10(*a*) is electrically grounded and a voltage for reproduction (hereinafter referred to as "reproducing voltage") is applied to the terminal 101-1. The voltage value of the reproducing voltage is set to, for example, "+0.5V." When the memory element (A) is applied with the reproducing voltage, a current having a current value according to the resistance value of the memory element (A) flows between the terminal 101-1 and the terminal 101-2.

A current value of the current flowing between the terminal 101-1 and the terminal 101-2 is detected, thereby obtaining the resistance value of the memory element (A) based on this current value and the voltage value (0.5V) of the reproducing voltage. When the resistance value of the memory element (A) is the high-resistance value "Rb," it is determined that the memory element (A) is in the "0" state, whereas when the resistance value of the memory element (A) is the low-resistance value "Ra," it is determined that the memory element (A) is in the "1" state. Thereby, bit data of the memory element (A) can be reproduced.

As described above, the memory element (A) with generation of inconstant resistance values suppressed are usable as the memory. The resistance variable thin film 2 forming the memory element (A) has a polycrystalline structure rather than the amorphous structure. Therefore, the memory element (A) is capable of maintaining reliability as a memory even after a long-time use, as compared to the conventional memory element. The storing, reset, and reproducing voltages applied to the terminals 101-1 and 101-2 are not limited to the above numeric values so long as positive pulses which are not lower than a predetermined level adapted to the memory element are applied to the terminals 101-1 and 101-2 during the storing and negative pulses which are not lower than a predetermined level adapted to the memory element are applied to the terminals 101-1 and 101-2 during the reset.

(Modification 1)

Figure 11:
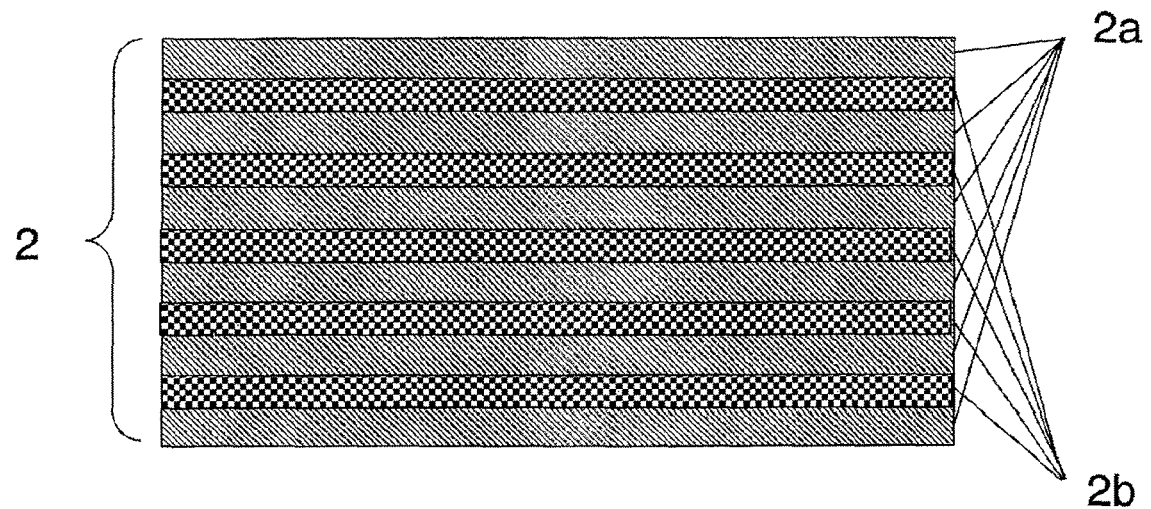
FIG. 11 is a view showing an example of a layer structure of a resistance variable thin film of the memory element according to Modification 1.

FIG. 11 is a view showing an example of a layer structure of the resistance variable thin film of a memory element according to Modification 1.

The memory element (A) of Embodiment 1 has a structure in which the $Fe_2O_3$ layer 2b is located inside the $Fe_3O_4$ layer 2a. Here, a structure of a memory element (A') of Modification 1 will be described. For the sake of convenience, in FIG. 1, the resistance variable thin film, the $Fe_3O_4$ layer, and the $Fe_2O_3$ layer are identified by the same references numerals as those for the resistance variable thin film, the $Fe_3O_4$ layer, and the $Fe_2O_3$ layer in FIG. 3.

Illustrated in FIG. 11 is the resistance variable thin film 2 of the memory element (A') having a structure in which five $Fe_2O_3$ layers 2b and six $Fe_3O_4$ layers 2a are alternately formed. An example of the thickness of the layers is such that the thickness of the $Fe_3O_4$ layer 2a is 10 nm, the thickness of the $Fe_2O_3$ layer 2b is 6 nm, and a total thickness of the layers 2a and 2b is 90 nm.

Subsequently, a manufacturing method of the memory element (A') will be described.

The manufacturing method of the memory element (A') is identical to the manufacturing method of the memory element (A) except for a forming method of the resistance variable thin film 2, and therefore a description for a manufacturing method common to these is omitted.

Initially, by a sputtering process using $Fe_3O_4$ as a target, the $Fe_3O_4$ layer 2a having a thickness of 10 nm is formed on the lower electrode 3. Then, on the $Fe_3O_4$ layer 2a, the $Fe_2O_3$ layer 2b having a thickness of 6 nm is formed by a sputtering process using $Fe_2O_3$ as a target 5 times and the $Fe_3O_4$ layer 2a having a thickness of 10 nm is formed by a sputtering process using $Fe_3O_4$ as a target 5 times in such a way that formation of the $Fe_2O_3$ layer 2b and formation of the $Fe_3O_4$ layer 2a are performed alternately. In this way, the memory element (A') including the resistance variable thin film 2 shown in FIG. 11 is manufactured.

For the above memory element (A'), a verification experiment similar to that for the memory element (A) was conducted. The verification result of the memory element (A') was substantially the same as that (see FIGS. 4 and 6) for the memory element (A). It should be noted that the resistance values of the memory element (A') were evaluated after being normalized using the largest resistance value of the memory element (A'). The largest resistance value of the memory element (A') was "approximately 1.5MΩ."

In accordance with this modification, the generation of the inconstant resistance values in the memory element (A') can be suppressed as compared to the generation of the inconstant resistance values in the conventional memory element (B). In addition, there is an advantage that by changing the number of $Fe_2O_3$ layers 2b, the largest resistance value can be changed so that the memory element (A') can be controlled to have a desired largest resistance value.

(Modification 2)

Figure 12:
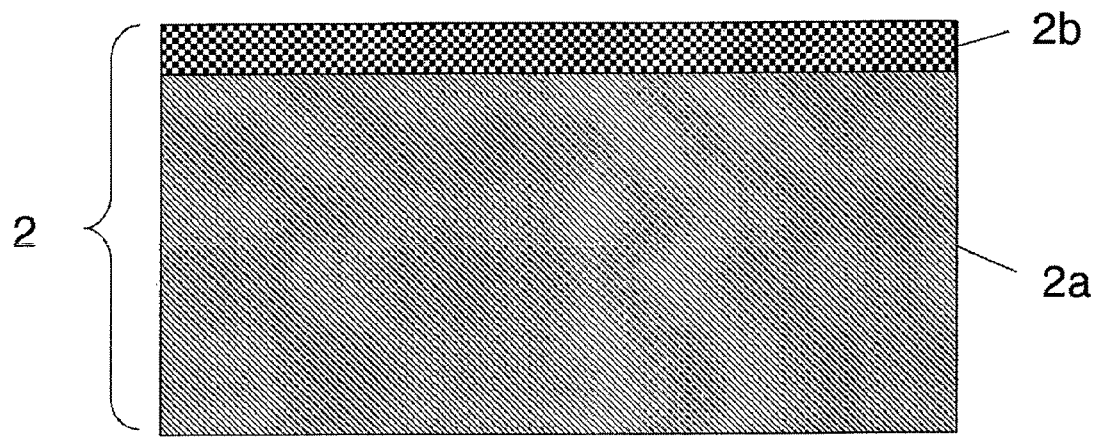
FIG. 12 is a view showing an example of a layer structure of a resistance variable thin film of a memory element according to Modification 2.

FIG. 12 is a view showing an example of a layer structure of a resistance variable thin film of a memory element according to Modification 2.

The memory element (A) of Embodiment 1 has a structure in which the $Fe_2O_3$ layer 2b is located inside the $Fe_3O_4$ layer 2a. Here, a structure of a memory element (A") of Modification 2 will be described. For the sake of convenience, in FIG. 12, the resistance variable thin film, the $Fe_3O_4$ layer, and the $Fe_2O_3$ layer are identified by the same references numerals as those for the resistance variable thin film, the $Fe_3O_4$ layer, and the $Fe_2O_3$ layer in FIG. 3.

FIG. 12 shows that the resistance variable thin film 2 of the memory element (A") has a structure in which one $Fe_2O_3$ layer 2b is provided on a front surface of the $Fe_3O_4$ layer 2a (in the vicinity of an interface with the upper electrode 1 which is closer to the upper electrode 1 in FIG. 1). One example (distribution example) of the thickness of the layers is such that the thickness of the $Fe_3O_4$ layer 2a is 80 nm, the thickness of the $Fe_2O_3$ layer 2b is 20 nm, and a total thickness of the layers 2a and 2b is 100 nm.

Alternatively, one $Fe_2O_3$ layer 2b may be provided on a rear surface of the $Fe_3O_4$ layer 2a.

Subsequently, a manufacturing method of the memory element (A") will be described.

The manufacturing method of the memory element (A") is identical to the manufacturing method of the memory element (A) except for a forming method of the resistance variable thin film 2, and therefore a description for a manufacturing method common to these is omitted.

Initially, by a sputtering process using $Fe_3O_4$ as a target, the $Fe_3O_4$ layer 2a having a thickness of about 80 nm is initially formed on the lower electrode 3. Then, by a sputtering process using $Fe_2O_3$ as a target, the $Fe_2O_3$ layer 2b having a thickness of about 20 nm is formed on the $Fe_3O_4$ layer 2a. In this way, the memory element (A") having the resistance variable thin film 2 shown in FIG. 12 is manufactured.

For the above memory element (A"), a verification experiment similar to that for the memory element (A) was conducted. The verification result of the memory element (A") was substantially the same as that (see FIGS. 4 and 6) for the memory element (A). It should be noted that the resistance values of the memory element (A") were evaluated after being normalized using the largest resistance value of the memory element (A"). The largest resistance value of the memory element (A") was "approximately 40 kΩ."

In accordance with this modification, the memory element (A") is capable of suppressing the generation of inconstant resistance values as compared to the conventional memory element (B). In addition, the memory element (A") can be manufactured suitably simply by performing the sputtering process twice.

(Modification 3)

Figure 13:
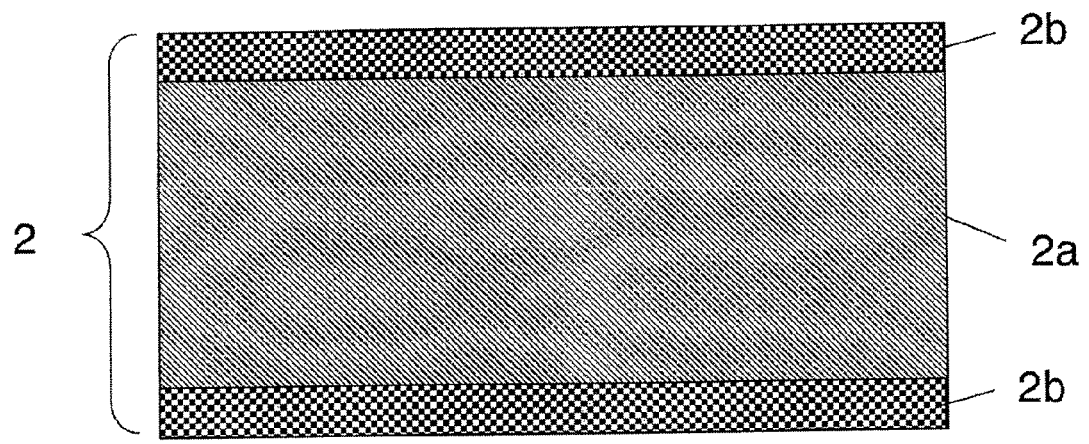
FIG. 13 is a view showing an example of a layer structure of a resistance variable thin film of a memory element according to Modification 3.

FIG. 13 is a view showing an example of a layer structure of the resistance variable thin film of a memory element according to Modification 3.

The memory element (A) of Embodiment 1 has a structure in which one $Fe_2O_3$ layer 2b is located inside the $Fe_3O_4$ layer 2a. Here, a structure of a memory element (A''') of Modification 3 will be described. For the sake of convenience, in FIG. 13, the resistance variable thin film, the $Fe_3O_4$ layer, and the $Fe_2O_3$ layer are identified by the same references numerals as those for the resistance variable thin film, the $Fe_3O_4$ layer, and the $Fe_2O_3$ layer in FIG. 3.

FIG. 13 shows that the resistance variable thin film 2 of the memory element (A''') has a structure in which one $Fe_2O_3$ layer 2b is provided on a front surface of the $Fe_3O_4$ layer 2a (in the vicinity of an interface with the upper electrode 1 which is closer to the upper electrode 1 in FIG. 1) and one $Fe_2O_3$ layer 2b is provided on a rear surface of the $Fe_3O_4$ layer 2a (in the vicinity of an interface with the lower electrode 3 which is closer to the lower electrode 3 in FIG. 1). One example (distribution example) of the thickness of the layers is such that the thickness of the $Fe_3O_4$ layer 2a is 80 nm, the thickness of the $Fe_2O_3$ layers 2b located at both sides of the $Fe_3O_4$ layer 2a is 10 nm, and a total thickness of the layers 2a and 2b is 100 nm.

Subsequently, a manufacturing method of the memory element (A''') will be described.

The manufacturing method of the memory element (A''') is identical to the manufacturing method of the memory element (A) except for a forming method of the resistance variable thin film 2, and therefore a description for a manufacturing method common to these is omitted.

Initially, by a sputtering process using $Fe_2O_3$ as a target, the $Fe_2O_3$ layer 2b having a thickness of 10 nm is formed on the lower electrode 3. Then, by a sputtering process using $Fe_3O_4$ as a target, the $Fe_3O_4$ layer 2a having a thickness of 80 nm is formed on the $Fe_2O_3$ layer 2b. Then, by a sputtering process using $Fe_2O_3$ as a target, the $Fe_2O_3$ layer 2b having a thickness of 10 nm is formed again on the $Fe_3O_4$ layer 2a. In this way, the memory element (A''') having the resistance variable thin film 2 shown in FIG. 13 is manufactured.

For the above memory element (A'''), a verification experiment similar to that for the memory element (A) was conducted. The verification result of the memory element (A''') was substantially the same as that (see FIGS. 4 and 6) for the memory element (A). It should be noted that the resistance values of the memory element (A''') were evaluated after being normalized using the largest resistance value of the memory element (A'''). The largest resistance value of the memory element (A''') was "approximately 60 kΩ."

In accordance with this modification, the memory element (A''') is capable of suppressing the generation of the inconstant resistance values compared to the conventional memory element (B).

(Modification 4)

The $Fe_2O_3$ layer 2b is not limited to the layer made of $\gamma$-$Fe_2O_3$ (maghemite) having a spinel structure described in this embodiment. The layer made of $\alpha$-$Fe_2O_3$ (hematite) having a corundum structure attains an effect of suppressing the generation of inconstant resistance values as in the $\gamma$-$Fe_2O_3$ layer 2b. The layer made both of $\gamma$-$Fe_2O_3$ (maghemite) and $\alpha$-$Fe_2O_3$ (hematite) attains an effect of suppressing the generation of the inconstant resistance values as in the $\gamma$-$Fe_2O_3$ layer 2b.

Figure 14:
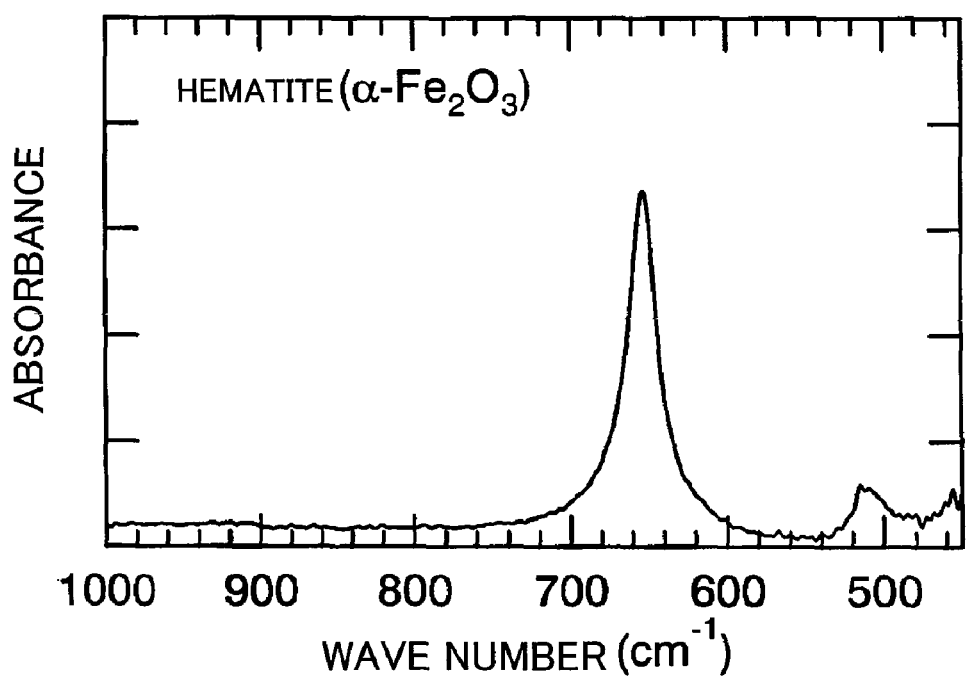
FIG. 14 is a view showing an infrared absorption spectrum curve of a crystalline structure of a α-$Fe_2O_3$ layer with a horizontal axis being a wave number and a vertical axis being absorbance.
Figure 15:
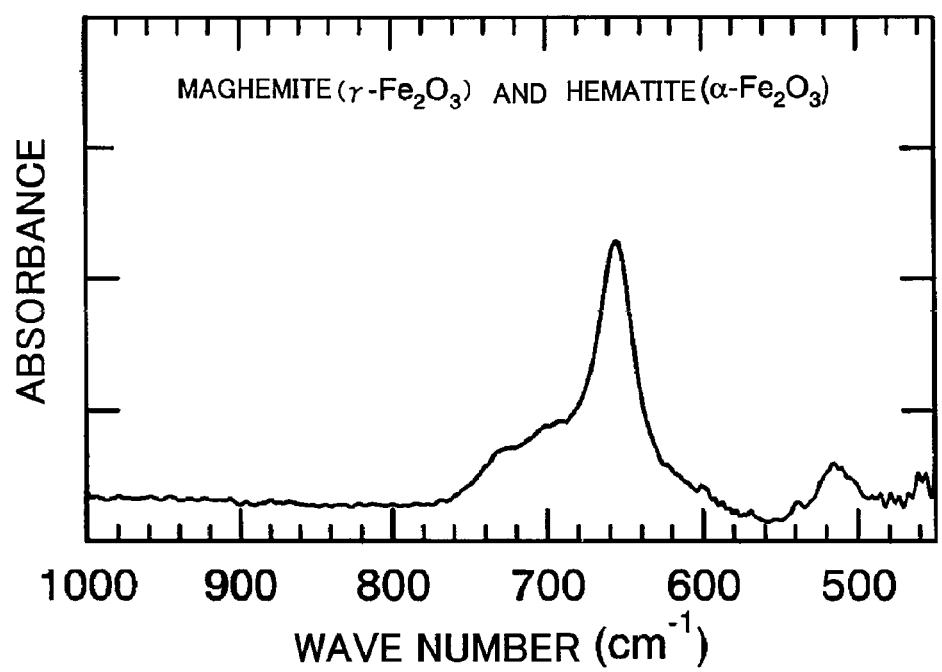
FIG. 15 is a view showing an infrared absorption spectrum curve of a crystalline structure of a layer made both of γ-$Fe_2O_3$ (maghemite) and α-$Fe_2O_3$ (hematite) with a horizontal axis being a wave number and a vertical axis being absorbance.

The crystalline structure of the $\alpha$-$Fe_2O_3$ layer is confirmed by a steep absorbance peak in a range from about $650^{-1}$ to $660^{-1}$ in an analysis result of an infrared absorption spectrum shown in FIG. 14. The crystalline structure of the layer made both of $\gamma$-$Fe_2O_3$ (maghemite) and $\alpha$-$Fe_2O_3$ (hematite) is confirmed by a steep absorbance peak in a range from about $650^{-1}$ to $660^{-1}$ and a broad absorbance peak in a range from about $680^{-1}$ to $730^{-1}$ in an analysis result of an infrared absorption spectrum shown in FIG. 15.

(Modification 5)

In this embodiment, as the manufacturing method of the $Fe_3O_4$ layer 2a and the $Fe_2O_3$ layer 2b, the sputtering process using $Fe_3O_4$ and $Fe_2O_3$ as targets is illustrated. The manufacturing method of the $Fe_3O_4$ layer and the $Fe_2O_3$ layer is not limited to this. For example, if an oxygen gas with a desired amount is mixed into an electric discharge gas (e.g., argon gas) for sputtering for the target of Fe, then the $Fe_3O_4$ layer and the $Fe_2O_3$ layer can be formed on the substrate by a reactive sputtering process without changing the targets.

(Modification 6)

Figure 16:
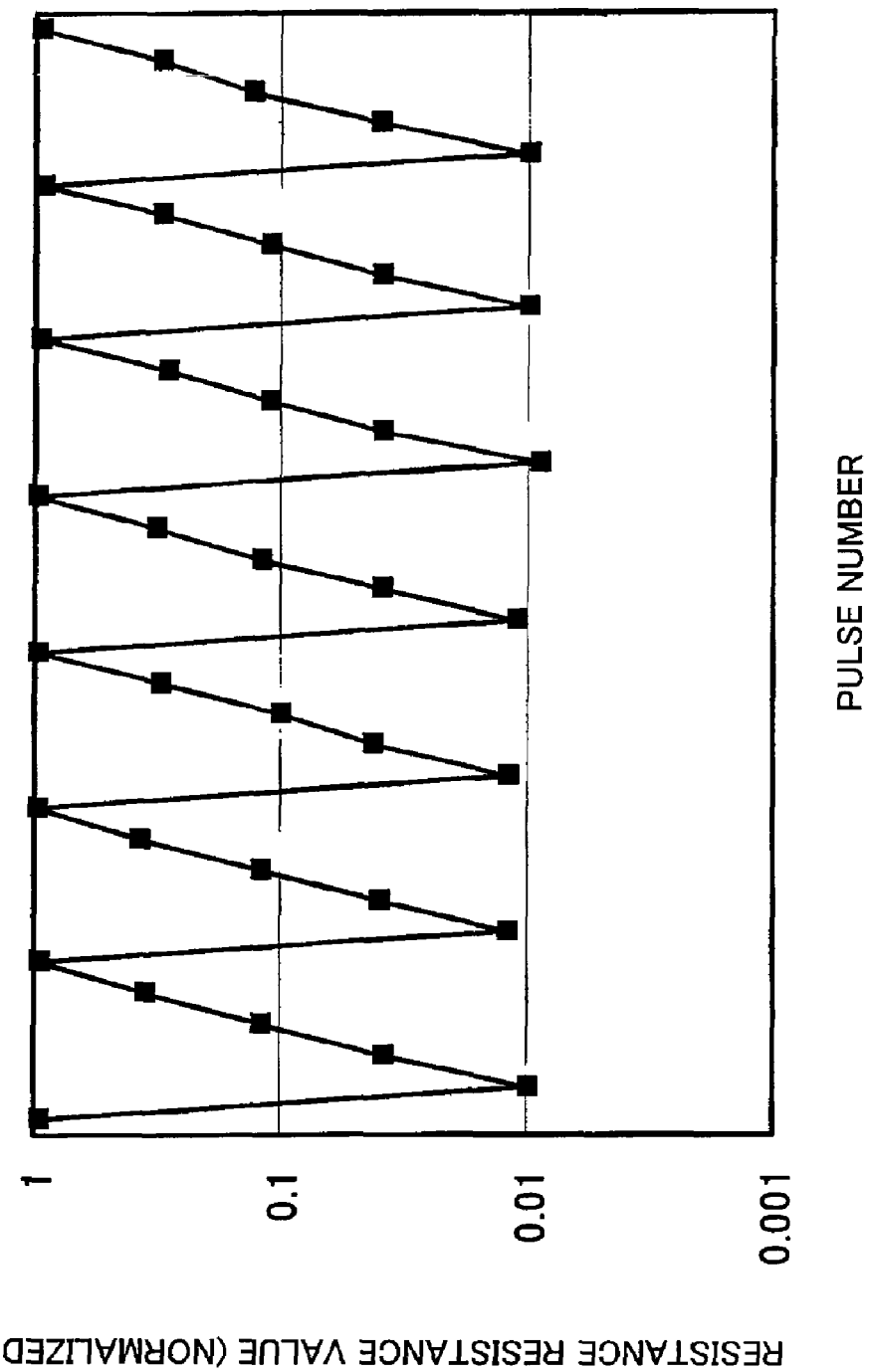
FIG. 16 is a view showing an example of a multi-valued memory element according to Modification 6.

In this embodiment, the memory element (A) has two resistance value states, and the numeric values are allocated to these two resistance values so that "1-bit" data are written and read out. As shown in FIG. 16, numeric values may be allocated to respective of three or more resistance values (in FIG. 16, five resistance states are illustrated) so that "multi-bit" data are written and read out. In this case, the voltage value or the number of times of the pulse voltage to be applied may be suitably controlled according to the values of the multi-bit data. For example, in the example of multi-valued memory element according to Modification 6 shown in FIG. 16, the resistance value (normalized value) of the memory element is configured to vary from "1" to "0.01" by applying a positive pulse voltage of "+3V" to the memory element, and to return from "0.01" to "1" by applying a negative pulse voltage of "−1V" to the memory element four times. This enables the memory element to take five different resistance values between "0.01" and "1." Thus, "multi-bit" data can be written and read out based on the resistance values of the memory element.

Embodiment 2

FIGS. 17 to 20 are views showing a configuration of Embodiment 2 of the present invention. FIG. 17(a) shows a schematic plan view of the configuration of a cross-point type nonvolatile memory element 320 as viewed from a substrate surface 321 of a semiconductor chip. As shown in FIG. 17(a), the nonvolatile memory element 320 includes a plurality of lower electrodes 322 formed to extend in parallel with each other on a substrate, and a plurality of upper electrodes 323 which are formed above the lower electrodes 322 so as to extend in parallel with each other within a plane parallel to a main surface of the substrate and so as to three-dimensionally the plurality of lower electrodes 322. A resistance variable film 324 is sandwiched between the lower electrodes 322 and the plurality of upper electrodes 323. In other words, the nonvolatile memory element 320 has a structure in which the stripe-shaped lower electrodes 323 formed on the substrate and the stripe-shaped upper electrodes 323 extending to three-dimensionally cross the lower electrodes 322 sandwich the resistance variable film 324.

Whereas in this embodiment, the lower electrodes 322 and the upper electrodes 323 three-dimensionally cross each other at a right angle, the present invention is not limited to this configuration. In this embodiment, the nonvolatile memory element 320 includes eight lower electrodes 322a, 322b, 322c, 322d, 322e, 322f, 322g, and 322h and eight upper electrodes 323a, 323b, 323c, 323d, 323e, 323f, 323g, and 323h, but this is merely exemplary. As matter of courses, it is needless to say that the number of the lower electrodes 322 and the number of the upper electrodes 323 may be set as desired.

The three-dimensional cross-points of the plurality of lower electrodes 322 and the plurality of upper electrodes 323 serve as memory portions 325. This means that the plurality of memory portions 325 are formed in matrix. The plurality of memory portions 325 have characteristics in which their resistance values increase or decrease by application of an electric pulse.

FIG. 17(b) is a schematic cross-sectional view of the nonvolatile memory element 320 in the direction of arrows along the line A-A of FIG. 17(a). As shown in FIG. 17(b), the lower electrodes 322 are formed on the substrate 326 of the semiconductor chip and upper portions of the lower electrodes 322 are covered with a first interlayer insulating film 327. $Fe_3O_4$ layers 329 forming the resistance variable film 342 are embedded in stripe-shaped grooves 328 formed to extend through the first interlayer insulating film 327 on the lower electrodes 322. On the first interlayer insulating film 327 and the $Fe_3O_4$ layers 329, spinel structure oxide layers 330 and the upper electrodes 323 are formed. The resistance variable film 324 is formed by a multi-layer resistance layer including one spinel structure oxide layer 330 and one $Fe_3O_4$ layer 329. The $Fe_3O_4$ layer 329 and the spinel structure oxide layer 330 are formed only at each of the intersections of the striped-shaped upper electrodes 323 and the stripe-shaped lower electrodes 322.

As shown in FIG. 17(b), the $Fe_3O_4$ layer 329 forming the memory portion 325 is electrically insulated from at least adjacent memory portion 325. Other layers may be added to the resistance variable film 324 so long as the resistance variable film 324 is formed by the multi-layer resistance film layer including at least one spinel structure oxide layer 330 and one $Fe_3O_4$ layer 329.

On the spinel structure oxide layer 330, the upper electrode 323, and the first interlayer insulating film 327, a second interlayer insulating film 332 is formed to cover the spinel structure oxide layer 330 and the upper electrode 323. The second interlayer insulating film 332 serves to protect the memory portion 325 of the nonvolatile memory element 320.

In the nonvolatile memory element 320 configured as described above, by applying an electric pulse to the memory portion 325 via the lower electrode 322 and the upper electrode 323, the resistance value of the resistance variable film 324 increases or decreases. According to the variation in the resistance value, the data is stored or read out. Thus, an element structure which enables electric insulation between adjacent memory cells (memory portions) and minituralization is attainable. Furthermore, in the case of the cross-point type nonvolatile memory element, an element structure which enables electric insulation between two dimensionally adjacent memory cells and further minituralization is attainable.

Figure 17:
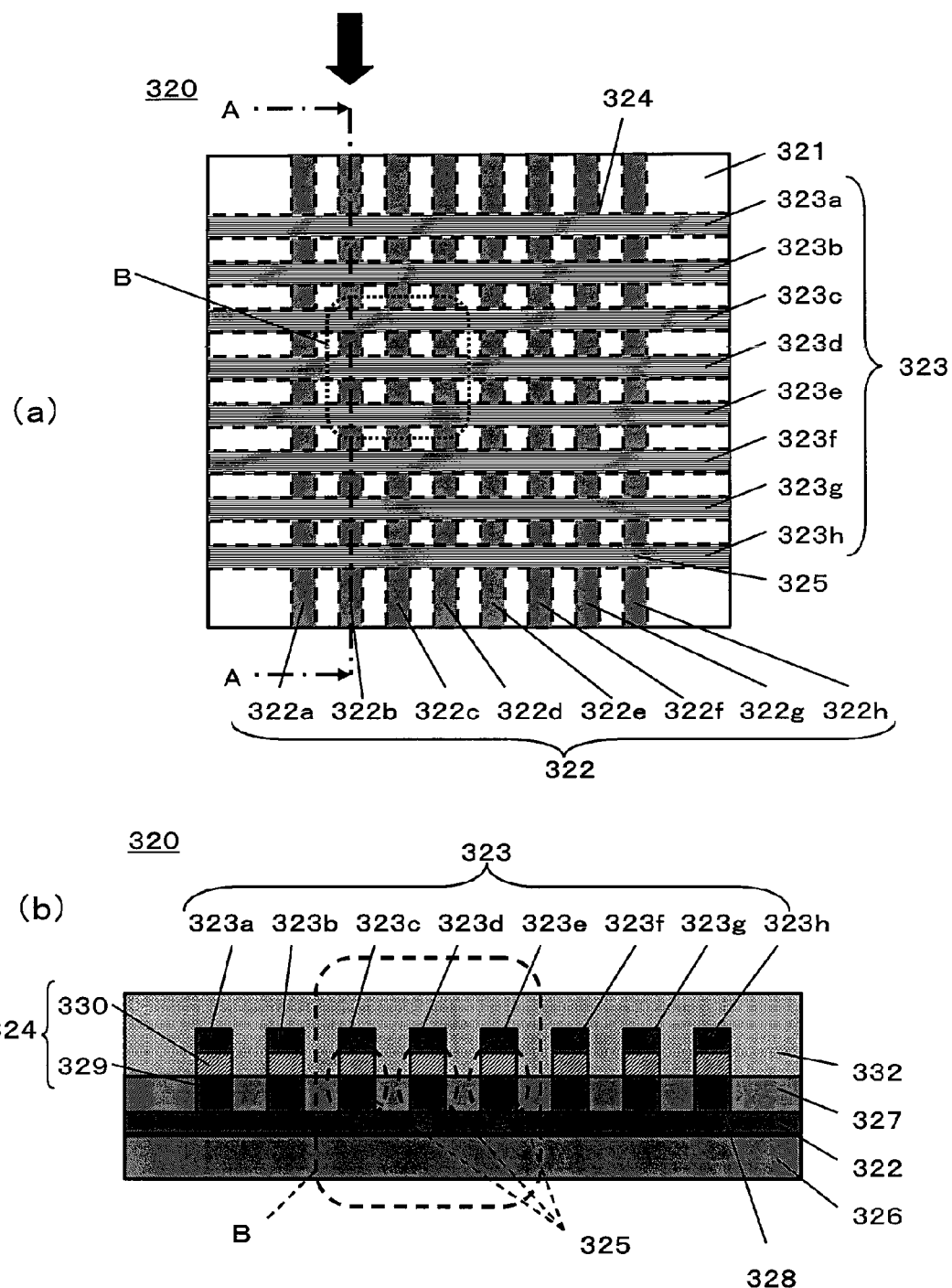
Figure 18:
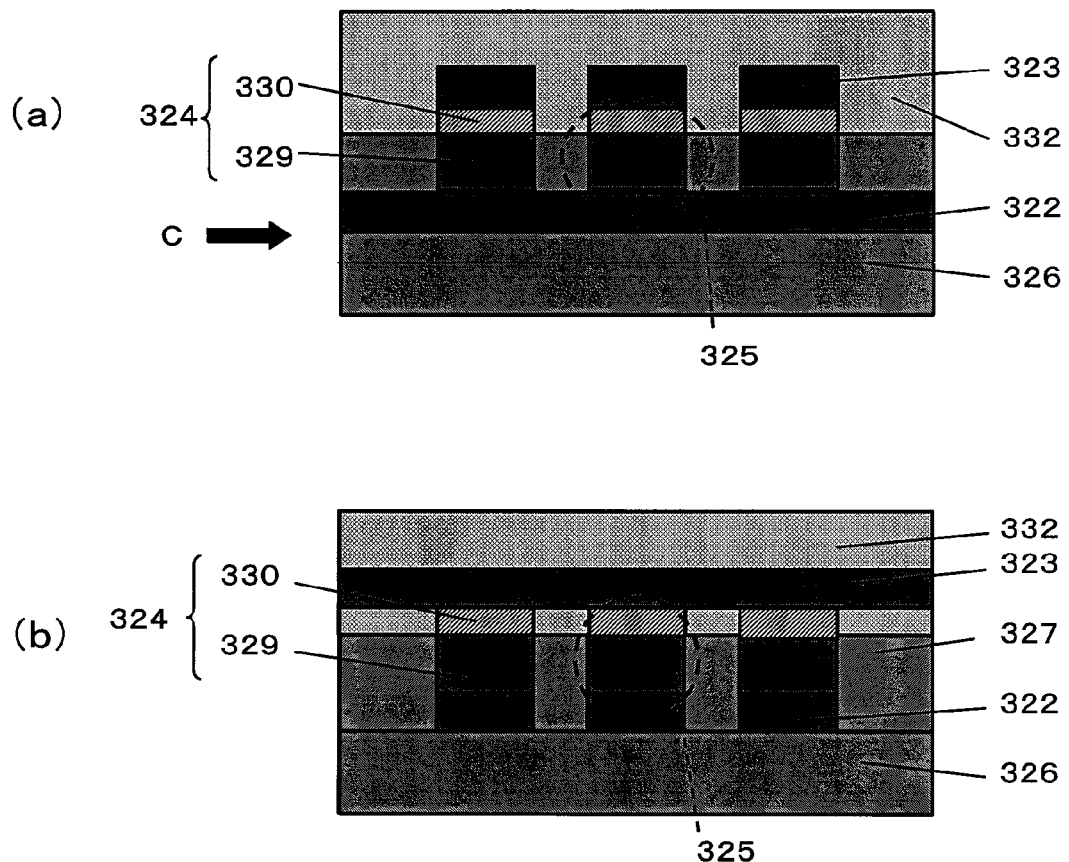
FIG. 18(a) is a schematic cross-sectional view of a B part of the nonvolatile memory element of FIG. 17(b), in the direction of arrows along the line A-A of FIG. 17(b), the B part being enlarged.
FIG. 18(b) is a schematic cross-sectional view taken in the direction of C in FIG. 18(a)

FIG. 18(*a*) is a schematic cross-sectional view of a B part of the nonvolatile memory element which is a constituent of the cross-point type nonvolatile memory element 320 shown in FIG. 17(*b*), the B part being enlarged. FIG. 18(*a*) is a cross-sectional view of the memory element including three memory portions 325. FIG. 18(*b*) is a schematic cross-sectional view taken in the direction of C in FIG. 18(*a*), showing the memory element including three memory portions 325.

As shown in FIG. 18(*a*), the resistance variable film 324 is sandwiched between the lower electrodes 322 and the upper electrodes 323 on the substrate 326. Each resistance variable film 324 forms the memory portion 325. As can be seen from the cross-sectional shape shown in FIG. 18(*a*), the three memory portions 325 are formed.

Each resistance variable film 324 is formed by a multi-layer resistance film layer including at least one spinel structure oxide layer 330 and one $Fe_3O_4$ layer 329. Whereas FIG. 18(*a*) shows that the resistance variable film 324 is formed by the two resistance film layers consisting of one spinel structure oxide layer 330 and one $Fe_3O_4$ layer 329, other layers may be added.

In this structure, since the resistance variable film 324 includes the spinel structure oxide layer 330 and the $Fe_3O_4$ layer 329 which is a spinel structure oxide having a different composition, an internal stress can be reduced in the resistance layers having the same crystalline structure. As a result, the resistance variable film 324 is capable of maintaining a large resistance variation rate, and of resistance variation at a high-speed. Therefore, the data stored in the memory portion 325 including a part of the resistance variable film 324 can be read out with a low current. In addition, the voltage and current consumed for rewriting the data can be made low.

In the nonvolatile memory element of this embodiment configured as described above, the resistance value of the resistance variable film 324 of the memory portion 325 increases or decreases by applying an electric pulse to the memory portion 325 via the lower electrode 322 and the upper electrode 323. According to the variation in the resistance value, the data can be stored or read out.

Since the resistance variable film is formed by the multi-layer resistance film layer including the spinel structure oxide layer as well as the $Fe_3O_4$ layer having excellent resistance varying characteristic, it has a proper resistance value. Thereby, a proper current can be flowed in the resistance variable film and a proper forming voltage can be applied thereto. Furthermore, an electric isolation between adjacent memory cells is provided so that occurrence of crosstalk is suppressed. As a result, an element structure capable of minituralization is attainable. Moreover, affinity with an interlayer insulating film forming step, an etching step and an embedding step of a layer forming material, and others in a planar process such as the conventional CMOS can be further obtained.

Figure 19:
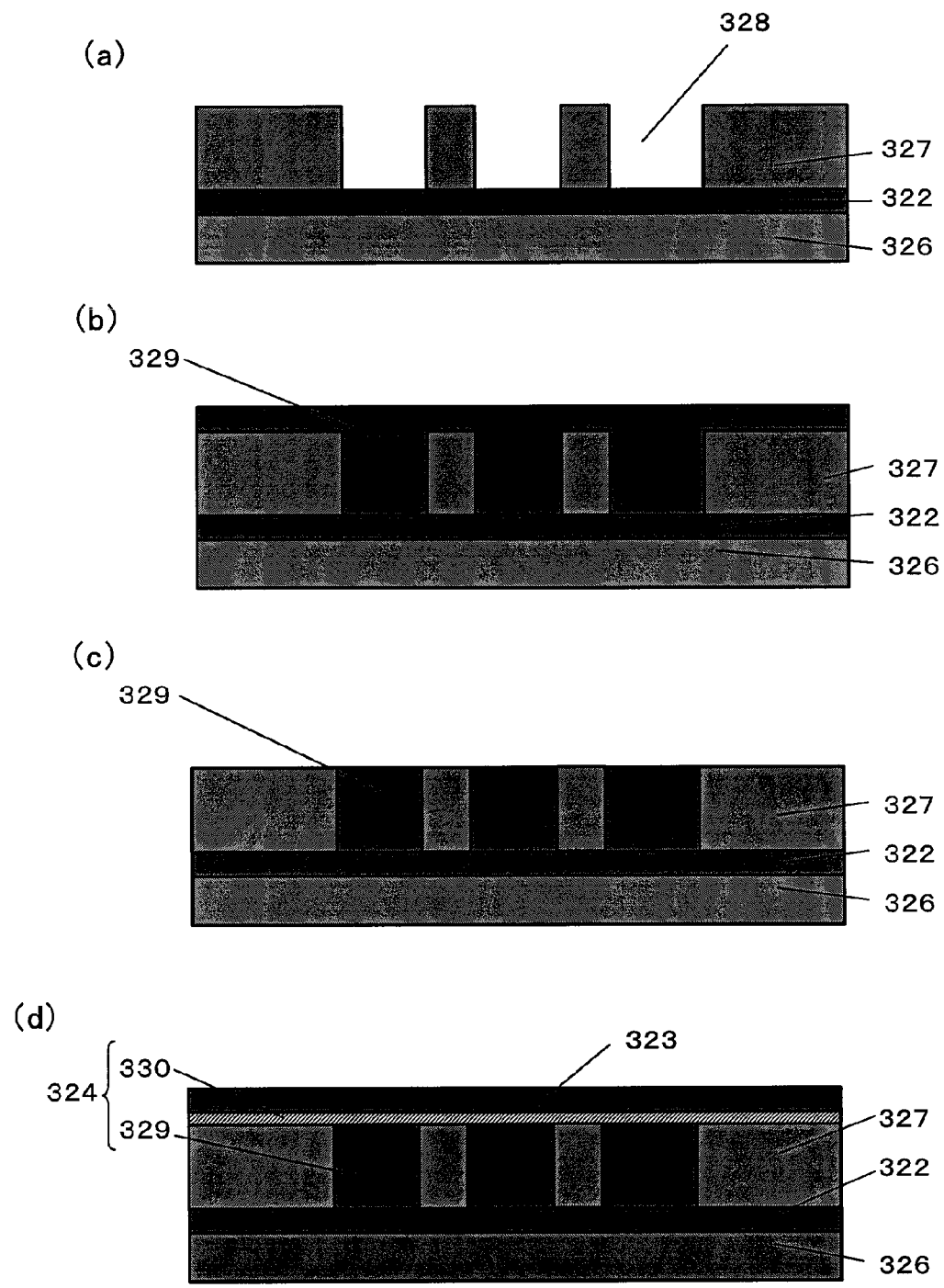
FIGS. 19(a) to 19(d) are step cross-sectional views showing a manufacturing method of a nonvolatile memory element used in Embodiment 2 of the present invention.
Figure 20:
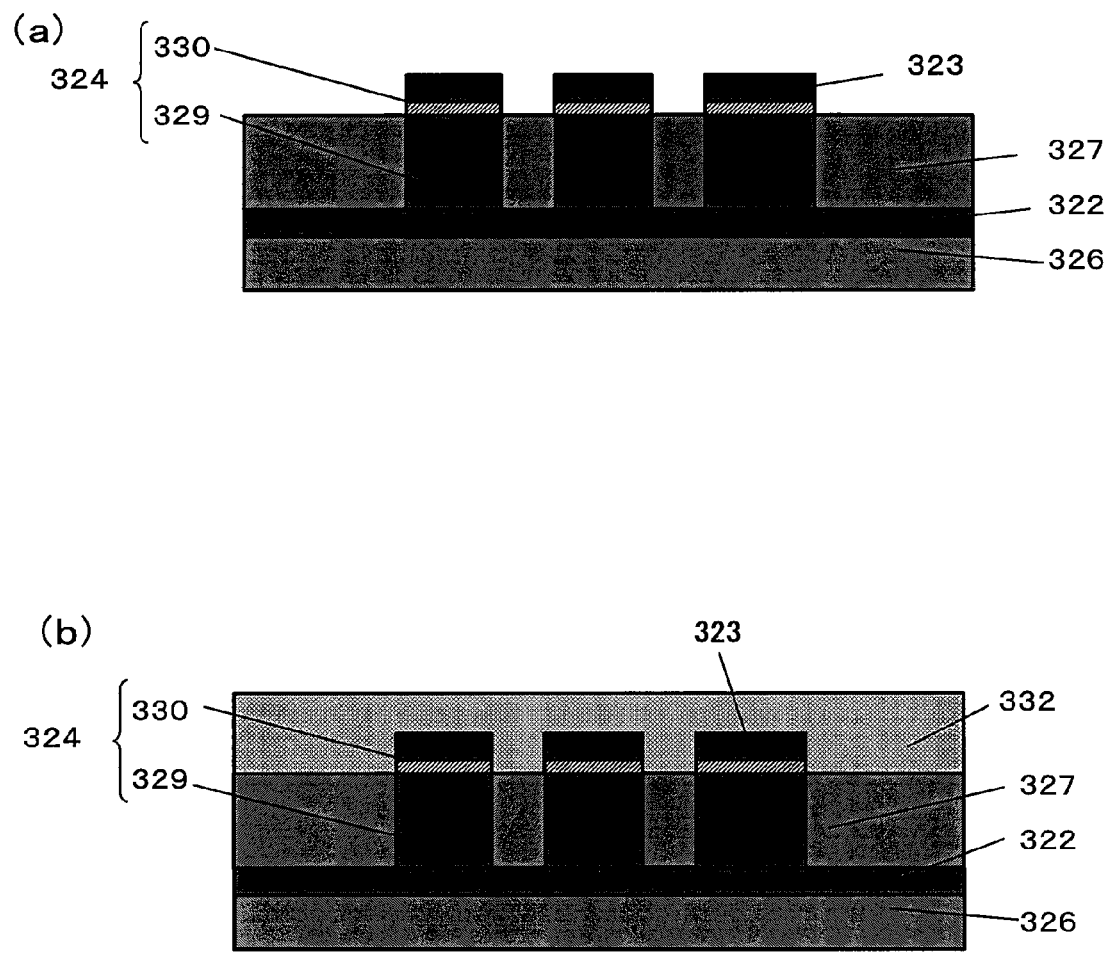
FIGS. 20(a) and 20(b) are step cross-sectional views showing a manufacturing method of the nonvolatile memory element used in Embodiment 2 of the present invention.

Subsequently, a manufacturing method of the nonvolatile memory element shown in FIG. 18(*a*) of this embodiment will be described. FIGS. 19(*a*) to 19(*d*) and FIGS. 20(*a*) and 20(*b*) sequentially show a process flow of the nonvolatile memory element shown in FIG. 18(*a*). To be specific, as shown in FIGS. 19 and 20, the manufacturing method of the nonvolatile memory element shown in FIG. 18(*a*) includes a step for forming the lower electrode 322 on the substrate 326, a resistance variable film forming step for forming the resistance variable film 324 on the lower electrode 322, and a step of forming the upper electrode 323 on the resistance variable film 324. The resistance film formation step is such that the resistance film formed by the multi-layer film resistance layer including at least one spinel structure oxide layer 330 and at least one $Fe_3O_4$ layer 329 is formed and the spinel structure oxide layer 330 and the $Fe_3O_4$ layer 329 are made of spinel structure oxide materials having different compositions.

As described above, the resistance variable film 324 may be formed by three or more layers. In this embodiment, illustrated is the resistance variable film 324 which is formed by the two resistance film layers including one spinel structure oxide layer 330 and one $Fe_3O_4$ layer 329.

As an example of the spinel structure oxide layer 330, $ZnFe_2O_4$ which is the spinel structure oxide is used.

As shown in FIG. 19(*a*), for example, the plurality of lower electrodes 322 made of Al material are formed on the substrate 326 made of Si material to extend in a predetermined direction and to have a width of 0.1 µm and a thickness of 0.1 µm by a vapor deposition process and an etching process. Then, a fluorine-doped oxide film is formed to have a thickness of 160 nm as the first interlayer insulating film 327 by a CVD process or the like so as to cover the substrate 326 and the lower electrodes 322.

Then, for example, by a dry etching process, the grooves 328 each having a width of 0.1 µm and a length of 0.7 µm equal to those of the lower electrode 322 are formed. Then, as shown in FIG. 19(*b*), transition metal oxide film material is sputtered to the grooves 328 by a sputtering process, thereby forming the $Fe_3O_4$ layers 329 having a thickness of 170 nm.

Then, as shown in FIG. 19(*c*), the $Fe_3O_4$ layers 329 stacked on the first interlayer insulating film 327 is removed to expose the surface of the first interlayer insulating film 327 using a CMP (chemical mechanical polishing) technique, leaving regions within the grooves 328. Then, as shown in FIG. 19(*d*), on the $Fe_3O_4$ layer 329 and the first interlayer insulating film 327 which are flattened by the CMP technique, for example, the spinel structure oxide layer 330 made of $ZnFe_2O_4$ material and having a thickness of 35 nm is formed by a sputtering process, and thereafter the upper electrode 323 made of Al material and having a thickness of 0.1 µm is formed on an upper portion of the spinel structure oxide layer 330 by, for example, a vapor deposition process.

Then, as shown in FIG. 20(*a*), the stripe-shaped upper electrodes 323 each having a width of 0.1 µm and a spacing of 0.1 µm are formed by photolithography so as to cross the lower electrodes 322 at a right angle, and then using the stripe-shaped upper electrode 323 as a mask, the spinel structure oxide layer 330 is formed into a stripe shape so as to have a width of 0.1 µm and a spacing of 0.1 µm, by for example, dry etching.

Then, as shown in FIG. 20(b), the second interlayer insulating film 332 having a thickness of 0.3 µm is formed as a fluorine-doped oxide film on the first interlayer insulating film 327 so as to cover the spinel structure oxide layers 330 and the upper electrodes 323 by, for example, the CVD process.

Figure 21:
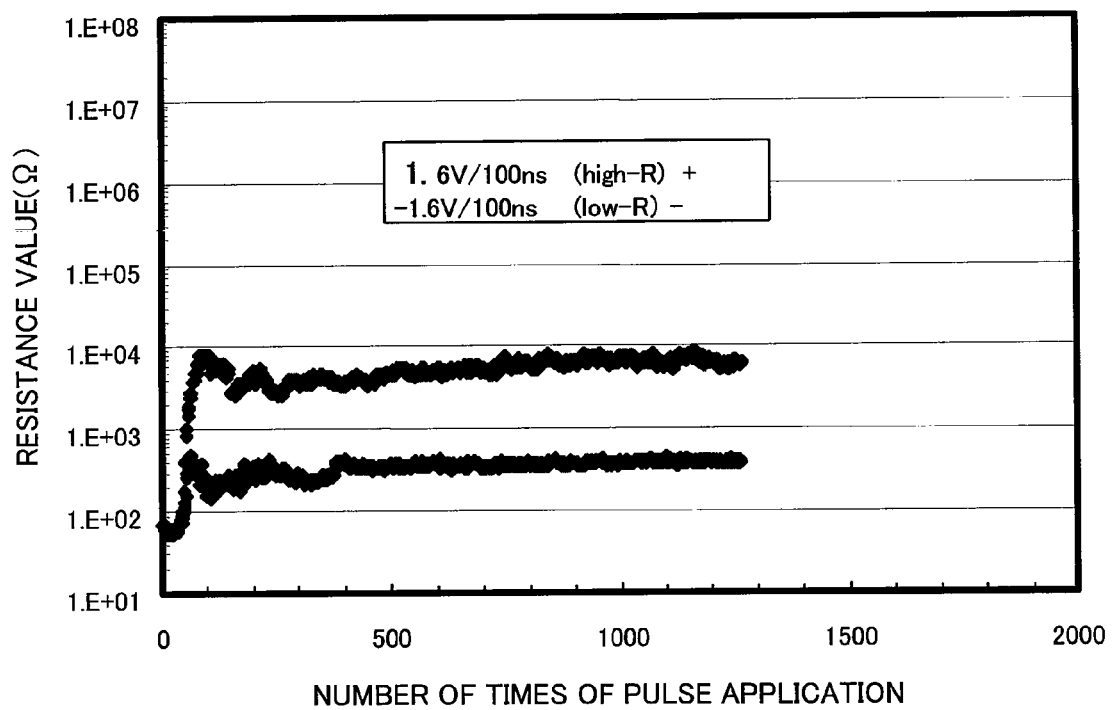
FIG. 21 is a view showing an operation result of the nonvolatile memory element according to Embodiment 2 of the present invention.

FIG. 21 shows an operation result of the nonvolatile memory element which occurs when the $ZnFe_2O_4$ layer having a thickness of 35 nm is used as the spinel structure oxide layer 330 and the $Fe_3O_4$ layer having a thickness of 160 nm is used as the $Fe_3O_4$ layers 329.

From the operation result shown in FIG. 21, it is found that two different resistance values 600Ω and 8KΩ are stably repeated alternately when electric pulses of different polarities each having a pulse width 100 nsec and a voltage 1.6V are alternately applied to the nonvolatile memory element via the upper electrode 323 and the lower electrode 322. In this embodiment, the experiment was continued until the number of times of pulse applications was above 1200 times, and during this period, the two different resistance values were stably repeated. As compared to the operation result shown in FIG. 26 described later, the high-resistance value for the $Fe_3O_4$ value is one-digit larger. With proper resistance values such as the low-resistance value of 600Ω and the high-resistance value of 8KΩ, a pulse current of about several mA flows with a several V pulse voltage. From this, it is found that the nonvolatile memory element operates at such a low current.

The thickness of the resistance variable film is a sum of 160 nm of the $Fe_3O_4$ layer 329 and 35 nm of the spinel structure oxide layer 330, i.e., 195 nm. If the thickness of the resistance variable film is less than 1 nm, crystallinity is sometimes inadequate under the influence of the interface of the lower electrode 322, etc, so that desired electric characteristics cannot be sometimes attained. On the other hand, if the thickness of the resistance variable film is above 200 nm, matching with a semiconductor process for forming other circuit regions and the like with minituralization is sometimes inadequate. In addition, the resistance value increases due to an increased thickness of the resistance variable film, causing a problem that the voltage value for causing the resistance variable film to vary the resistance increases. It is therefore desired that the thickness of the resistance variable film be not smaller than 1 nm and not larger than 200 nm. This makes it possible to attain a resistance variable film which obtains sufficient affinity with the semiconductor process for forming miniaturized constituents, and has desired crystallinity and proper resistance values.

Whereas described in this embodiment is that the spinel structure oxide layer is stacked on the $Fe_3O_4$ layer, the present invention is not limited to this, but the $Fe_3O_4$ layer may be stacked on the spinel structure oxide layer. This is because the above described advantage is achieved by the fact that the resistance value of the spinel structure oxide is higher than that of the $Fe_3O_4$ layer.

Whereas described in this embodiment is that the spinel structure oxide layer and the $Fe_3O_4$ layer are formed and stacked only at the intersection of each of the line-shaped upper electrodes and each of the line-shaped lower electrodes, it is obvious that the present invention may provide a configuration in which the $Fe_3O_4$ layer and the spinel structure oxide layer may be formed to have a line shape.

Whereas described in this embodiment is that the resistance variable film includes one $Fe_3O_4$ layer and one spinel structure oxide layer, the nonvolatile memory element may alternatively be formed to include the resistance variable film having a layer structure in which each of the spinel structure oxide layers and each of the $Fe_3O_4$ layers are stacked in repetition in the manner as described in Embodiment 1. In further alternative, the nonvolatile memory element may be formed to include a resistance variable film having a complex structure in which the spinel structure oxide layer and the $Fe_3O_4$ layer are formed simultaneously.

Whereas in this embodiment, as the wire material, Al or W is used, Pt or Cu used in the semiconductor process may be used.

Whereas in this embodiment, as the electrode material, W is used, other electrode material, such as Cu, Pt, Al, TiN, TaN, or TiAlN may be used.

COMPARATIVE EXAMPLE AGAINST SECOND EMBODIMENT

Comparative Example 1

As Comparative example 1, a nonvolatile memory element in which the resistance variable film consist of the $Fe_3O_4$ layer will be described. In this case, the nonvolatile memory element has a structure in which the spinel structure oxide which is expressed as $MFe_2O_4$ (M: metal element except for Fe) is not formed unlike this embodiment, but the upper electrode is stacked directly on the $Fe_3O_4$ layer.

Figure 22:
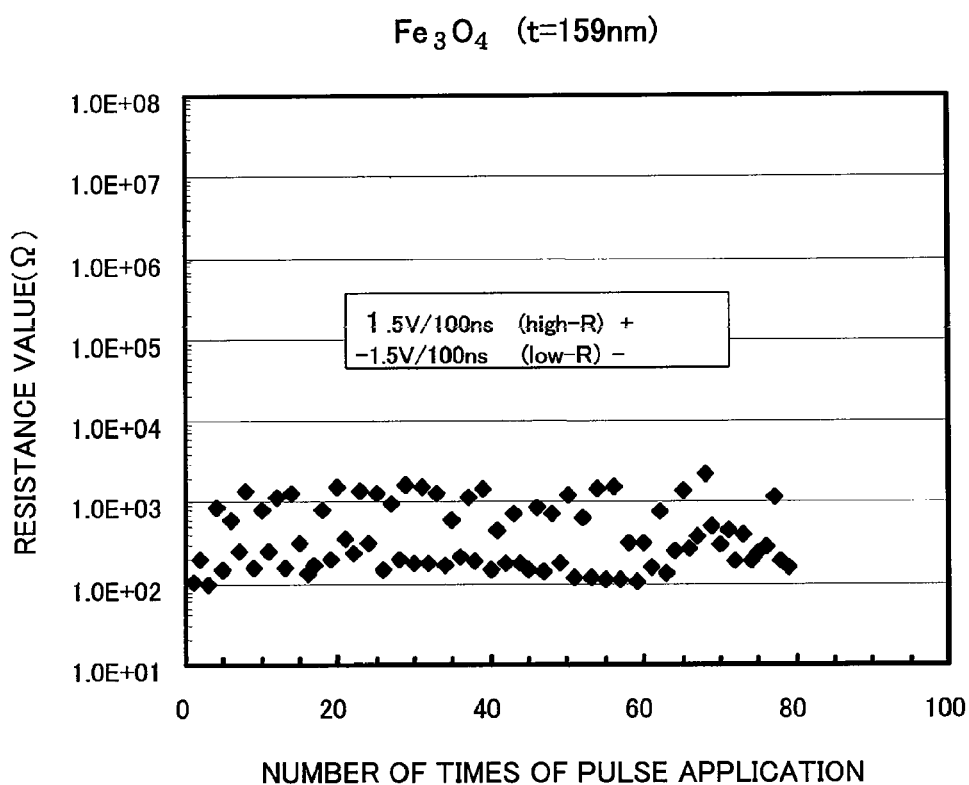
FIG. 22 is a view showing an operation result of Comparative example 1 in which the resistance variable film of the nonvolatile memory element consists of the $Fe_3O_4$ layer.

FIG. 22 is a graph showing the relation between the resistance value and the number of times of pulse application of the nonvolatile memory element according to Comparative example. In this case, the nonvolatile memory element includes the resistance variable film consisting of the $Fe_3O_4$ layer having a thickness of 159 nm. FIG. 22 shows a result in a case where electric pulses of different polarities each having a pulse width of 100 nsec and a voltage of 1.5V are applied alternately to the nonvolatile memory element thus configured via the upper electrode and the lower electrode.

As can be seen from FIG. 22, two different resistance values, i.e., 100Ω to 300Ω and 800Ω to 1.3 KΩ are alternately repeated. In this Comparative example in which the resistance variable film consists of only the $Fe_3O_4$ layer, two different resistance values are each turned to be inconstant when the number of times of pulse application is about 80, and the high-resistance value is five to ten times as large as the low-resistance value, and thus is not very large relative to the low-resistance value. As should be understood from this, even though the number of times of pulse application is as small as about 80, Comparative example 1 does not operate stably after the pulse application of 80 times.

On the other hand, in the operation of the nonvolatile memory element according to Embodiment 2, the resistance variation rate is 13 or larger, and is higher than that of Comparative example 1. Also, as can be seen from FIG. 21, a steady low-resistance value and a steady high-resistance value are repeated. From this, it is found that the structure of the resistance variable film 345 formed by the multi-layer resistance film layer including at least one spinel structure oxide layer 330 and one $Fe_3O_4$ layer 329 is effective to enable the nonvolatile memory element to operate stably in the manner as described in Embodiment 2.

Comparative Example 2

Figure 23:
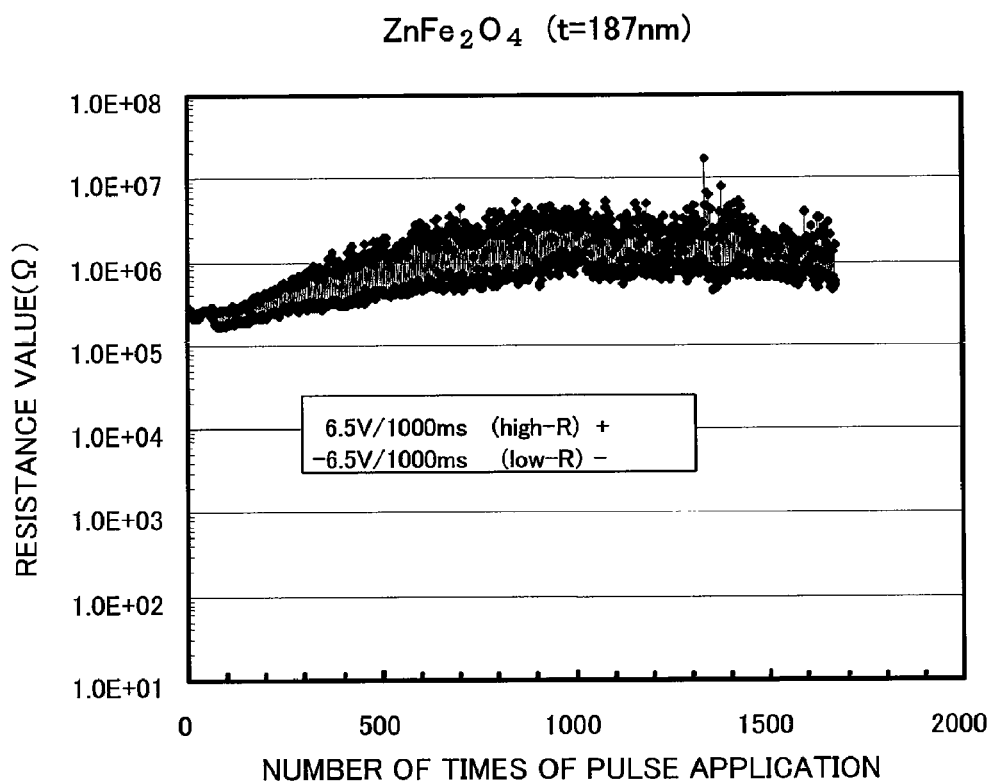
FIG. 23 is a view showing an operation result of Comparative example 2 in which the resistance variable film of the nonvolatile memory element consists of a spinel structure oxide layer ($ZnFe_2O_4$)

As comparative example 2, an element using as the resistance variable film 324 only $ZnFe_2O_4$ which is the spinel structure oxide layer 330 will be described. FIG. 23 shows an experiment result. The spinel structure oxide $ZnFe_2O_4$ has a composition expressed as $MFe_2O_4$ in which Zn is selected for M and is formed to have a thickness of 187 nm. It can be seen that the electric pulses of different polarities each having a pulse width of 1000 msec and a voltage of 6.5V are applied alternately to the nonvolatile memory element via the upper electrode 323 and the lower electrode 322, and thereby two different resistance values 800 KΩ and 2 MΩ are repeated alternately. However, a problem that a pulse width is very long and the resistance variation rate is small arises. Further, a problem that an operation voltage is high arises.

Comparative Example 3

Figure 24:
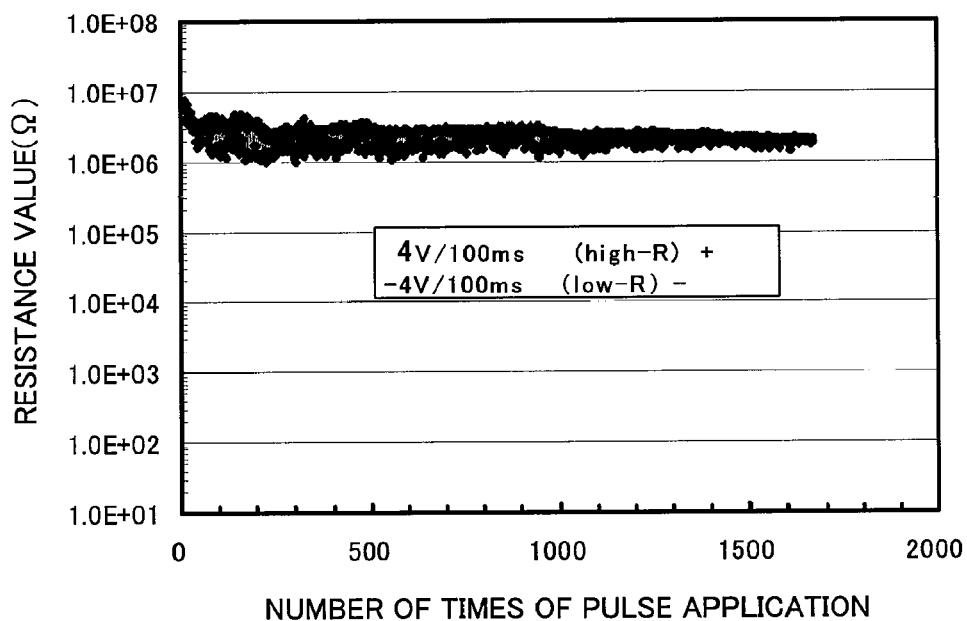
FIG. 24 is a view showing an operation result of Comparative example 3 in which the resistance variable film of the nonvolatile memory element consists of a spinel structure oxide layer ($MnFe_2O_4$)

As comparative example 3, an element using as the resistance variable film 324 only the spinel structure oxide layer 330 made of $MnFe_2O_4$ in which Mn is selected for M, will be described. FIG. 24 shows an experiment result. The spinel structure oxide $MnFe_2O_4$ is formed to have a thickness of 122 nm at a substrate temperature of 400° C. It can be seen that the electric pulses of different polarities each having a pulse width of 100 msec and a voltage of 4V are applied alternately to the nonvolatile memory element via the upper electrode 323 and the lower electrode 322, and thereby two different resistance values, i.e., 1.1 to 1.5 MΩ and 2MΩ are repeated alternately steadily. However, a problem that a pulse width is very long and the resistance variation rate is small arises. Further, a problem that an operation voltage is high arises.

As described with reference to FIGS. 21 to 24, the nonvolatile memory element 320 including the resistance variable film 324 in which the spinel structure oxide layer 330 such as $ZnFe_2O_4$ and the $Fe_3O_4$ layer 329 are stacked is operated with an electric pulse for rewriting data which is much higher than that for the nonvolatile memory element including the resistance variable film consisting of the spinel structure oxide layer 330. In addition, rewrite voltage and a rewrite current can be reduced. Furthermore, the low-resistance variation region of the nonvolatile memory element can be changed to a high-resistance state appropriately. As a result, the nonvolatile memory element is capable of a low-current operation stably at a proper voltage value.

The cause for the effect produced by using the layer structure of the spinel structure oxide layer and the $Fe_3O_4$ layer is not clear. It may be presumed that the effect is attained by the fact that the oxides having the same crystalline structure are deposited so as to make the interface between the layers favorable and so as to reduce a residual stress due to difference in material between the respective layers, and thereby electron migration between electron orbits such as 3d orbits of Fe which is associated with electric conduction in the $Fe_3O_4$ layer and the spinel structure oxide layer is not impeded.

Whereas in this embodiment, $Fe_3O_4$ is used, a transition metal oxide having a similar characteristic may be used. It is desirable to use the $Fe_3O_4$ layer whose resistance rate is not smaller than $1 \times 10^{-4}$ Ωcm and not larger than $5 \times 10^{-2}$ Ωcm. The range of the resistance rate is defined assuming that $Fe_3O_4$ has a spinel structure as a crystalline structure.

Whereas in this embodiment, $ZnFe_2O_4$ is used as the material for the spinel structure oxide layer, a spinel structure oxide of a transition metal oxide (e.g., $NiFe_2O_4$, $CoFe_2O_4$, and $CuFe_2O_4$) having a similar characteristic may be used. It is desirable to use a spinel oxide layer whose resistance rate is not smaller than 10 Ωcm and not larger than $10^7$ Ωcm. The resistance rate of $ZnFe_2O_4$ and the resistance rate of $NiFe_2O_4$ are not smaller than 10 Ωcm and not larger than $10^4$ Ωcm. The resistance rate of $CoFe_2O_4$ is not smaller than $10^4$ Ωcm and not larger than $10^7$ Ωcm. The resistance rate of $CuFe_2O_4$ is not smaller than $10^2$ Ωcm and not larger than $10^5$ Ωcm.

As described above, the nonvolatile memory element according to this embodiment is the cross-point type memory element including the resistance variable film having the $Fe_3O_4$ layer and the spinel structure oxide layer. The present invention is not limited to the cross-point type nonvolatile memory element, but a memory element of a one transistor/ one nonvolatile memory portion type may be configured to include a resistance variable film similar to that of this embodiment.

Embodiment 3

In this embodiment, as an application example of the memory element (A) described in Embodiment 1, a configuration and operation of a memory apparatus 200 including the memory element (A) will be described.

<Configuration of Memory Apparatus 200>

Figure 25:
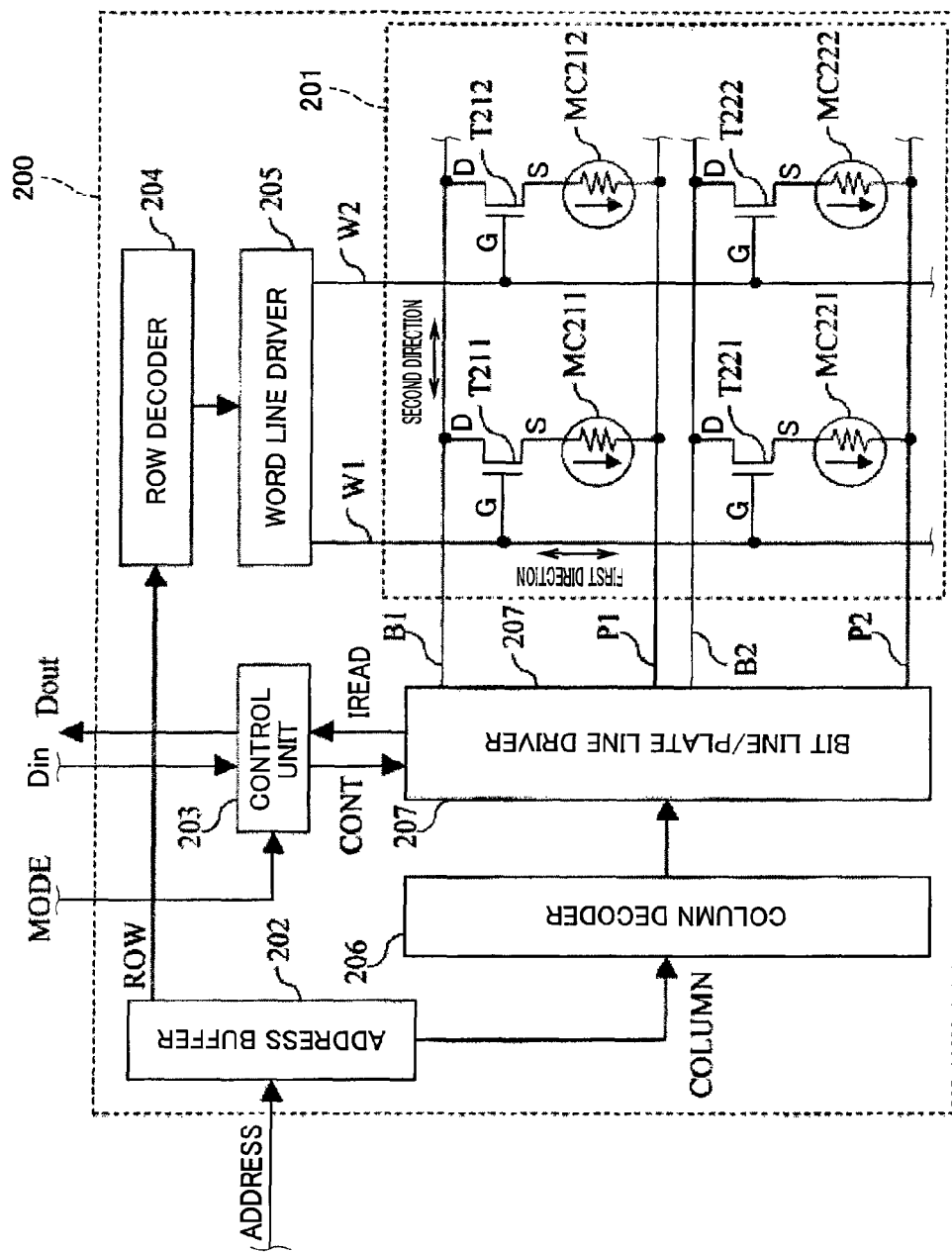
FIG. 25 is a block diagram showing an example of a configuration of a memory apparatus according to Embodiment 3.

FIG. 25 is a block diagram showing an example of a configuration of a memory apparatus of this embodiment.

A memory apparatus 200 includes a memory array 201, an address buffer 202, a control unit 203, a row decoder 204, a word line driver 205, a column decoder 206, and a bit line/ plate line driver 207.

As shown in FIG. 25, the memory array 201 includes two word lines W1 and W2 extending in a first direction, two bit lines B1 and B2 extending in a second direction so as to cross the word lines W1 and W2, two plate lines P1 and P2 extending in the second direction to respectively correspond to the bit lines B1 and B2, four transistors T211, T212, T221, and T222 provided in matrix to respectively correspond to intersections of the word lines W1 and W2 and the bit lines B1 and B2, and four memory cells MC211, MC212, MC221, and MC222 provided in matrix to respectively correspond to the transistors T211, T212, T221, and T222. As a matter of course, the number of constituents is not limited to that described herein. Whereas in the memory apparatus 200 of FIG. 25, an example in which the memory array 201 is configured to include the four memory cells MC211, MC212, MC 221, and MC222 is illustrated, it may be configured to include five or more memory cells arranged in matrix.

Each of the memory cells MC211, M212, MC221, and MC222 corresponds to the memory element (A) shown in FIG. 8 of Embodiment 1.

The transistor T211 and the memory cell MC211 are arranged in series between the bit line B1 and the plate line P1 so that a source of the transistor T211 is connected to the terminal 101-1 (see FIG. 8) of the memory cell 211. More specifically, the transistor T211 is connected to the bit line B1 and the memory cell MC211 between the bit line B1 and the memory cell MC211, while the memory cell MC211 is connected to the transistor T211 and the plate line P1 between the transistor T211 and the plate line P1. A drain of the transistor T211 is connected to the bit line B1 and the terminal 101-2 (see FIG. 8) of the memory cell M211 is connected to the plate line P1. A gate of the transistor T211 is connected to the word line W1.

Since connection states of the remaining three transistors T212, T221, and T222 and the three memory cells MC212, MC211, and MC222 arranged in series with these transistors T212, T221, and T222 should be easily understood from the above description and with reference to FIG. 25, they will not be further described.

In this configuration, when a predetermined voltage (activation voltage) is applied to each of the gates of the transistors T211, T212, T221, and T222 via the word line W1 or the word line W2, the drain-source of each of the transistors T211, T212, T221, and T222 is turned to be an electrically conductive state.

The address buffer 202 receives an address signal ADDRESS from an external circuit (not shown), and outputs a row address signal ROW to the row decoder 204 and a column address signal COLUMN to the column decoder 206, based on the address signal ADDRESS. The address signal ADDRESS is a signal indicating an address of one selected from among the memory cells MC211, MC212, MC221, and MC222. The row address signal ROW is a signal indicating a row address of addresses indicated by the address signal ADDRESS, while the column address signal COLUMN is a signal indicating an address of a column of the addresses indicated by the address signal ADDRESS.

The control unit 203 selects one mode from among a storing mode, a reset mode, and a reproducing mode according to a mode selection signal MODE received from an external In the storing mode, the control unit 203 outputs to the bit line/plate line driver 207 a control signal CONT for causing "storing voltage application," according to input data Din received from an external circuit. In the reproducing mode, the control unit 203 outputs to the bit line/plate line driver 207 a control signal CONT for causing "reproducing voltage application." In the reproducing mode, the control unit 203 further receives a signal IREAD output from the bit line/plate line driver 207, and outputs to the external circuit output data Dout indicating a bit value according to the signal IREAD. The signal IREAD is a signal indicating a current value of a current flowing in the plate lines P1 and P2 in the reproducing mode. In the reset mode, the control unit 203 checks a storing state of each of the memory cells MC211, MC212, MC221, and MC222, and outputs to the bit line/plate line driver 207 a control signal CONT for causing "reset voltage application" according to the storing state.

The row decoder 204 receives the row address signal ROW output from the address buffer 202, and selects either one of the two word lines W1 and W2 according to the address signal ROW. The word line driver 205 applies an activation voltage to the word line selected by the row decoder 204 based on the output signal of the row decoder 204.

The column decoder 206 receives the column address signal COLUMN from the address buffer 202, and selects one of the two bit lines B1 and B2 and one of the two plate lines P1 and P2, according to the column address signal COLUMN.

Receiving the control signal CONT for causing "storing voltage application" from the control unit 203, the bit line/plate line driver 207 applies a storing voltage VWRITE to the bit line selected by the column decoder 206 based on the output signal of the column decoder 206 and places the plate line selected by the column decoder 206 in an electrically grounded state.

Receiving the control signal CONT for causing "reproducing voltage application" from the control unit 203, the bit line/plate line driver 207 applies a reproducing voltage VREAD to the bit line selected by the column decoder 206 based on the output signal of the column decoder 206 and places the plate line selected by the column decoder 206 in an electrically grounded state. Thereafter, the bit line/plate line driver 207 outputs to the control unit 203 a signal IREAD indicating a current value of a current flowing in the plate line.

Receiving the control signal CONT for causing "reset voltage application" from the control unit 203, the bit line/plate line driver 207 applies a reset voltage VRESET to the bit line selected by the column decoder 206 based on the output signal of the column decoder 206 and places the plate line selected by the column decoder 206 in an electrically grounded state.

The voltage value of the storing voltage VWRITE is set to, for example, "+2V" and its pulse width is set to, for example, "100 nsec." The voltage value of the reproducing voltage VREAD is set to, for example, "+0.5V." The voltage value of the reset voltage VRESET is set to, for example, "−2V" and its pulse width is set to, for example, "100 nsec."

<Operation of Memory Apparatus 200>

Subsequently, an example of the operation of the memory apparatus 200 shown in FIG. 25 will be described.

The memory apparatus 200 operates in the storing mode in which input data Din is written to a memory cell, the reset mode in which the data written in the memory cell is reset, and the reproducing mode in which the data written in the memory cell is output (reproduced) as output data Dout. Hereinafter, the operations in these modes will be described sequentially.

For the convenience of description below, it is assumed that the memory cells MC211, MC212, MC221, and MC222 are each initialized to a high-resistance state, and the address signal ADDRESS is a signal indicating the address of the memory cell MC211.

[Storing Mode]

First, an example of the operation in the storing mode of the memory apparatus 200 will be described.

The control unit 203 receives the input data Din from the external circuit. When the input data Din is "1," the control unit 203 outputs to the bit line/plate line driver 207 a control signal CONT for causing "storing voltage application." On the other hand, when the input data Din is "0," the control unit 203 does not output the control signal CONT.

Next, receiving the control signal CONT for causing "storing voltage application" from the control unit 203, the bit line/plate line driver 207 applies a storing voltage VWRITE to the bit line B1 selected by the column decoder 206. In addition, the bit line/plate line driver 207 places the plate line P1 selected by the column decoder 206 in an electrically grounded state.

In this case, the word line driver 205 applies an activation voltage to the word line W1 selected by the row decoder 204. Thereby, the drain-source of the transistor T211 is placed in an electrically conductive state.

Accordingly, a pulse voltage (positive pulse) as the storing voltage VWRITE in which the voltage value is set to "+2V" and the pulse width is set to "100 nsec" is applied to the memory cell MC211, causing the resistance value of the memory cell MC211 to vary from a high-resistance value to a low-resistance value. On the other hand, since a positive pulse is not applied to the memory cells MC221 and MC222, and the activation voltage is not applied to the gate of the transistor T212 connected in series to the memory cell MC212, the resistance state of the memory cells MC212, MC221, and MC222 do not change.

In this way, the resistance state of only the memory cell MC211 can be changed to the low-resistance state. Thereby, 1-bit data indicating "1" corresponding to the low-resistance state is written to the memory cell MC211 (1-bit data can be stored therein).

When writing to the memory cell MC211 is completed, a new address signal ADDRESS is input to the address buffer 202, so that the above described operation in the storing mode of the memory apparatus 200 is repeated for the memory cells except for the memory cell MC211.

[Reproducing Mode]

Next, an example of the operation in the reproducing mode of the memory apparatus 200 will be described.

The control unit 203 outputs to the bit line/plate line driver 207 the control signal CONT for causing "reproducing voltage application."

Then, receiving the control signal CONT for causing "reproducing voltage application" from the control unit 203, the bit line/plate line driver 207 applies the reproducing voltage VREAD to the bit line B1 selected by the column decoder 206 and places the plate line P1 selected by the column decoder 206 in an electrically grounded state.

In this case, the word line driver 205 applies an activation voltage to the word line W1 selected by the row decoder 204, causing the drain-source of the transistor T211 to be placed in an electrically conductive state.

Thereby, a measurement voltage as the reproducing voltage VREAD with the voltage value set to "+0.5V" is applied to the memory cell MC211, causing a current indicating a current value according to the resistance value of the memory cell MC211 to flow into the plate line P1 through the memory cell MC211.

Since the measurement voltage is not applied to the memory cell MC221 and MC222, and the activation voltage is not applied to the gate of the transistor T212 connected in series to the memory cell MC212, the current does not flow in the memory cells MC212, MC221, and MC222.

Then, the bit line/plate line driver 207 measures a current value of a current flowing in the plate line P1 and outputs to the control unit 203 a signal IREAD indicating its measurement value.

Then, the control unit 203 outputs to outside an output data Dout according to a current value indicated by the signal IREAD. For example, in the case of a current value of a current flowing when the memory cell MC211 is in the low-resistance state, the control unit 203 outputs output data Dout indicating "1."

Since a current according to the state of the resistance value of the memory cell MC211 flows in only the memory cell MC211 and the current flows into the plate line P1, 1-bit data can be read out (1-bit data can be reproduced) from the memory cell MC211.

When reading out of the data from the memory cell MC211 is completed, a new address signal ADDRESS is input to the address buffer 202, so that the above described operation in the reproducing mode of the memory apparatus 200 is repeated for the memory cells except for the memory cell MC211.

[Reset Mode]

Subsequently, an example of the operation in the reset mode of the memory apparatus 200 will be described.

Initially, the control unit 203 executes the operation in the reproducing mode to obtain the state (storing state) of the resistance value of the memory cell MC211.

Then, if it is determined that the memory cell MC211 contains bit data indicating "1" (it is determined that the memory cell MC211 is in the low-resistance state), the control unit 203 outputs to the bit line/plate line driver 207 the control signal CONT for causing "reset voltage application." On the other hand, if it is determined that the memory cell MC211 contains bit data indicating "0" (if it is determined that the memory cell MC211 is in the high-resistance state), the control unit 203 does not output to the bit line/plate line driver 207 the control signal CONT.

Then, receiving the control signal CONT for causing "reset voltage application" from the control unit 203, the bit line/plate line driver 207 applies a reset voltage VRESET to the bit line B1 selected by the column decoder 206. In addition, the bit line/plate line driver 207 places the plate line P1 selected by the column decoder 206 in an electrically grounded state.

In this case, the word line driver 205 applies an activation voltage to the word line W1 selected by the row decoder 204. Thereby, the drain-source of the transistor T211 is placed in an electrically conductive state.

Accordingly, a pulse voltage (negative pulse) as the reset voltage VRESET in which the voltage value is set to "−2V" and the pulse width is set to "100 nsec" is applied to the memory cell MC211, causing the resistance value of the memory cell MC211 to vary from a low-resistance value to a high-resistance value. On the other hand, since a negative pulse is not applied to the memory cells MC221 and MC222, and the activation voltage is not applied to the gate of the transistor T212 connected in series to the memory cell MC212, the resistance state of the memory cells MC212, MC221, and MC222 do not change.

In this way, the resistance state of only the memory cell MC2111 can be changed to the high-resistance state. Thereby, 1-bit data indicating "1" corresponding to the low-resistance state stored in the memory cell MC211 is reset to indicate "0" corresponding to the high-resistance state.

When resetting of the memory cell MC211 is completed, a new address signal ADDRESS is input to the address buffer 202, so that the above described operation in the reset mode of the memory apparatus 200 is repeated for the memory cells except for the memory cell MC211.

As described above, by incorporating the memory element (A) described in Embodiment 1 into the memory array 201 as the memory cells MC211, MC212, MC221, and MC222, and by using the memory array 201, the memory apparatus 200 can be configured. The memory apparatus 200 of this embodiment is capable of suppressing generation of inconstant resistance values in the memory cells MC211, MC212, MC221, and MC222, and of reducing a defective rate due to the inconstant resistance values in the memory cells MC211, MC212, MC221, and MC222. As a result, the memory apparatus 200 can be manufactured with a high yield. In particular, in accordance with the memory apparatus 200 of this embodiment, the memory array 201 including the memory elements (A) which occupies a large part of the memory apparatus 200 can be manufactured with high precision. Therefore, the memory apparatus 200 can significantly improve a yield as compared to the conventional memory apparatus.

It should be noted that the resistance variable thin film forming the memory element (A) has a multi-crystalline structure rather than an amorphous structure. Therefore, the memory apparatus 200 is capable of maintaining a reliability as the memory array even after a long-time use as compared to the conventional memory apparatus.

Embodiment 4

In this embodiment, as an application example of the memory apparatus 200 described in Embodiment 3, a configuration and operation of a first semiconductor integrated circuit (Embedded-RAM) 300 (hereinafter referred to as a "semiconductor integrated circuit 300") into which the memory apparatus 200 is incorporated will be described.

<Configuration of Semiconductor Integrated Circuit 300>

Figure 26:
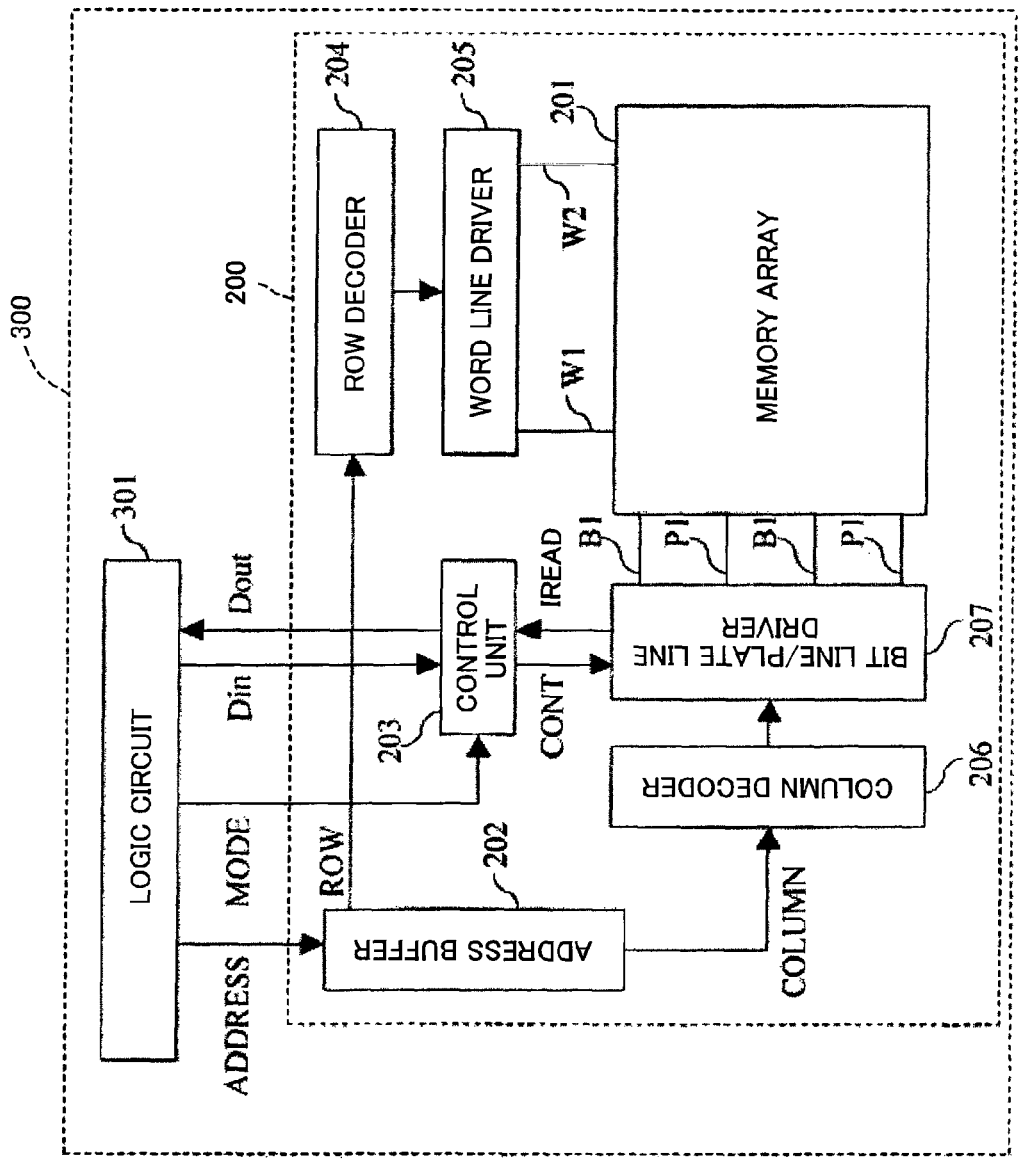
FIG. 26 is a block diagram showing an example of a configuration of a semiconductor integrated circuit (Embedded-RAM) according to Embodiment 4.

FIG. 26 is a block diagram showing an example of a configuration of a semiconductor integrated circuit (Embedded-RAM) according to this embodiment. The semiconductor integrated circuit 300 includes the memory apparatus 200 described in Embodiment 3 (FIG. 25) and a logic circuit 301, and is a circuit formed on one semiconductor chip. The memory apparatus 200 is used as data RAM. The configuration of the memory apparatus 200 has been already described in detail in Embodiment 3, and therefore will not be described. The logic circuit 301 is a circuit for executing predetermined calculation (e.g., encoding/decoding of audio data and image data), and carries out the calculation using the memory apparatus 200. To be specific, the logic circuit 301 is configured to control an address signal ADDRESS and a mode selection signal MODE for the memory apparatus 200. Thereby, the data is written to and read out from the memory apparatus 200.

<Operation of Semiconductor Integrated Circuit 300>

Subsequently, an operation of the semiconductor integrated circuit 300 shown in FIG. 26 will be described. The operation of the semiconductor integrated circuit 300 includes a write process (storing mode) for writing predetermined data (bit data) to the memory apparatus 200, a readout process (reproducing mode) for reading out the data written in the memory apparatus 200, and a reset process (reset mode) for resetting the data written in the memory apparatus 200. Hereinafter, the operations of the processes will be sequentially described. In the operation below, the operations in the "storing mode," the "reproducing mode," and "reset mode" of the memory apparatus 200 described in Embodiment 3 are used, and a detailed description of the operation of the memory apparatus 200 is omitted.

[Write Process]

Initially, the write process performed by the semiconductor integrated circuit 300 with respect to the memory apparatus 200 will be described.

In order to write predetermined data (e.g., encoded motion picture data) to the memory apparatus 200, the logic circuit 301 outputs to the control unit 203 a mode selection signal MODE indicating the "storing mode" of the memory apparatus 200.

Next, in order to select memory cells to which the predetermined data are to be written, the logic circuit 301 sequentially outputs address signals ADDRESS to the address buffer 202 in the memory apparatus 200. Thereby, in the memory apparatus 200, the memory cells according to the address signals ADDRESS are sequentially selected.

Then, the logic circuit 301 outputs to the control unit 203 of the memory apparatus 200 the predetermined data bit by bit as 1-bit data Din.

Then, in the memory apparatus 200, the operation similar to that in the storing mode described in Embodiment 3 is performed. Thereby, the predetermined data is written bit by bit to the memory apparatus 200.

[Readout Process]

Subsequently, the readout process performed by the semiconductor integrated circuit 300 from the memory apparatus 200 will be described.

In order to read out the data written in the memory apparatus 200, the logic circuit 301 outputs to the control unit 203 the mode selection signal MODE indicating the "reproducing mode" of the memory apparatus 200.

Next, in order to select memory cells from which the data written therein are to be read out, the logic circuit 301 sequentially outputs address signals ADDRESS to the address buffer 202 in the memory apparatus 200. Thereby, in the memory apparatus 200, the memory cells according to the address signals ADDRESS are sequentially selected.

Then, in the memory apparatus 200, the operation similar to that in the reproducing mode described in Embodiment 3 is performed. Thereby, the data stored in the memory apparatus 200 is read out bit by bit as the output data Dout.

[Reset Operation]

Subsequently, a reset process performed by the semiconductor integrated circuit 300 with respect to the memory apparatus 200 will be described.

In order to reset the data written in the memory apparatus 200, the logic circuit 301 outputs to the control unit 203 the mode selection signal MODE indicating the "reset mode" of the memory apparatus 200.

Next, in order to select memory cells for which the data stored in the memory apparatus 200 are to be reset, the logic circuit 301 sequentially outputs address signals ADDRESS to the address buffer 202 in the memory apparatus 200. Thereby, in the memory apparatus 200, the memory cells according to the address signals ADDRESS are sequentially selected.

Then, in the memory apparatus 200, the operation similar to that in the reset mode described in Embodiment 3 is performed. Thereby, the data stored in the memory apparatus 200 is reset bit by bit.

As described above, the semiconductor integrated circuit 300 can be configured using the memory apparatus 200 described in Embodiment 3. The semiconductor integrated circuit 300 of this embodiment is capable of suppressing generation of inconstant resistances in the memory cells MC211, MC212, MC221, and MC222 within the memory apparatus 200. Thereby, the semiconductor integrated circuit 300 is capable of reducing a defective rate due to the generation of the inconstant resistance values in the memory cells MC211, MC212, MC221, and MC222. As a result, the semiconductor integrated circuit 300 can be manufactured with a high yield.

The semiconductor integrated circuit 300 of this embodiment suitably enables the memory apparatus 200 with a significantly improved yield to store a large volume of data therein.

Embodiment 5

In this embodiment, as another application example of the memory apparatus 200 described in Embodiment 3, a configuration and operation of a semiconductor integrated circuit (reconfigurable LSI) 400 into which the memory apparatus 200 is incorporated will be described.

<Configuration of Second Semiconductor Integrated Circuit>

Figure 27:
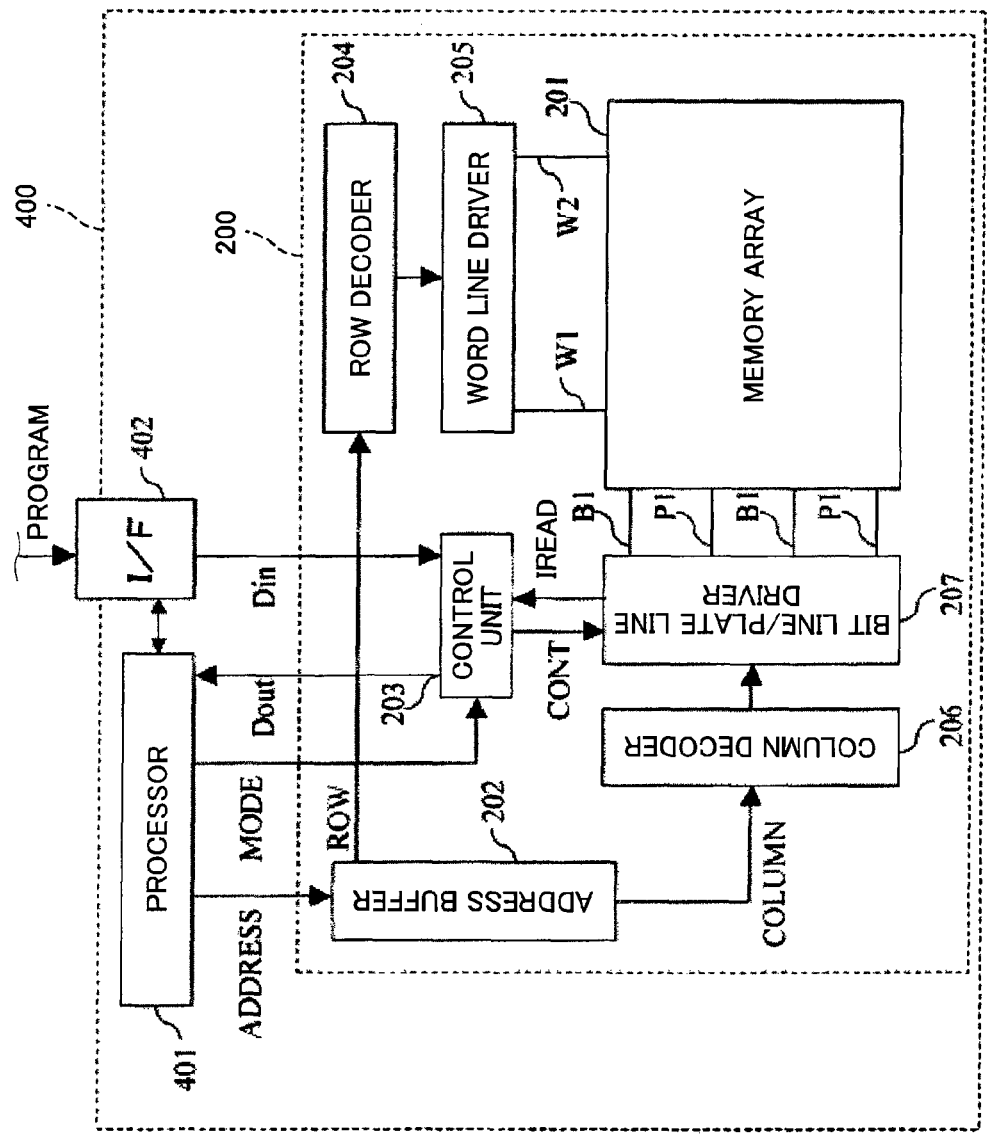
FIG. 27 is a block diagram showing an example of a configuration of a semiconductor integrated circuit (reconfigurable LSI) according to Embodiment 5.

FIG. 27 is a block diagram showing an example of a configuration of a semiconductor integrated circuit (reconfigurable LSI) according to this embodiment.

The semiconductor integrated circuit 400 includes the memory apparatus 200 described in Embodiment 3 (FIG. 25), a processor 401, and an interface 402 which are formed on one semiconductor chip. The memory apparatus 200 is used as a program ROM and is configured to store programs required for the operation of the processor 401. The configuration of the memory apparatus 200 has been already described in detail in Embodiment 3, and will not be further described. The processor 401 operates according to the program stored in the memory apparatus 200 and controls the memory apparatus 200 and the interface 402. The programs input from an external device (not shown) are sequentially output to the memory apparatus 200 via the interface 402.

<Operation of Second Semiconductor Integrated Circuit 400>

Subsequently, an operation of the semiconductor integrated circuit 400 shown in FIG. 27 will be described. The operation of the semiconductor integrated circuit 400 includes a program running process (program running mode) for operating according to the program stored, and a program rewrite process (program rewrite mode) for rewriting the program stored in the memory apparatus 200 into a new program. In the operation below, the operations in the "storing mode," the "reproducing mode," and "reset mode" of the memory apparatus 200 described in Embodiment 3 are used, and a detailed description of the operation of the memory apparatus 200 is omitted.

[Program Running Process]

Initially, the program running process of the semiconductor integrated circuit 400 will be described.

In order to read out the program stored in the memory apparatus 200, the processor 401 outputs to the control unit 203 the mode selection signal MODE indicating the "reproducing mode" of the memory apparatus 200.

Next, the processor 401 sequentially outputs to the address buffer 202 of the memory apparatus 200 address signals ADDRESS indicating the memory cells in which desired programs are written. Thereby, in the memory apparatus 200, the memory cells according to the address signals ADDRESS are sequentially selected.

Then, in the memory apparatus 200, the operation similar to that in the storing mode described in Embodiment 3 is performed. Thereby, the program stored in the memory apparatus 200 is read out bit by bit as output data Dout.

In this way, the processor 401 executes predetermined calculation according to the program read out.

[Program Rewrite Process]

Subsequently, a program rewrite process of the semiconductor integrated circuit 400 will be described.

In order to delete the programs (programs to be rewritten) stored in the memory apparatus 200, the processor 401 outputs to the control unit 203 the mode selection signal MODE indicating the "reset mode" of the memory apparatus 200.

Then, the processor 401 sequentially outputs to the address buffer 202 of the memory apparatus 200 address signals ADDRESS indicating locations of the memory cells in which the programs to be rewritten are stored. Thereby, in the memory apparatus 200, the memory cells according to the address signals ADDRESS are sequentially selected.

Then, in the memory apparatus 200, the operation similar to that in the reset mode described in Embodiment 3 is performed. Thereby, the programs stored in the memory cells are reset bit by bit.

When the reset operation of the memory cell is completed, the processor 401 then outputs to the control unit 203 the mode selection signal MODE indicating the "storing mode" of the memory apparatus 200 in order to write new programs.

Then, the processor 401 sequentially outputs to the address buffer 202 in the memory apparatus 200 the address signals ADDRESS indicating the locations of the memory cells for which the new programs are to be stored. Thereby, in the memory apparatus 200, the memory cells according to the address signals ADDRESS are sequentially selected.

Then, the processor 401 outputs to the control unit 203 of the memory apparatus 200 bit by bit via the interface 402 from outside. In the memory apparatus 200, the process similar to that in the storing mode described in Embodiment 3 is performed. Thereby, the new programs are stored in the memory apparatus 200 bit by bit.

Since the memory apparatus 200 is a nonvolatile memory capable of rewriting, it is capable of rewriting the contents of the programs stored therein. That is, a function attained by the processor 501 can be easily altered. Alternatively, a plurality of programs can be stored in the memory apparatus 200, and the function attained by the processor 401 can be altered according to the programs read out.

As described above, the semiconductor integrated circuit 400 can be configured using the memory apparatus 200 described in Embodiment 3. The semiconductor integrated circuit 400 of this embodiment is capable of suppressing the generation of the inconstant resistances in the memory cells MC211, MC212, MC221, and MC222 within the memory apparatus 200. Thereby, the semiconductor integrated circuit 400 is capable of reducing a defective rate due to the generation of the inconstant resistance values in the memory cells MC211, MC212, MC221, and MC222. As a result, the semiconductor integrated circuit 400 can be manufactured with a high yield.

In accordance with the semiconductor integrated circuit 400 of this embodiment, suitably, different functions are attainable (so-called reconfigurable) with one processor (LSI) using the memory apparatus 200 with a significantly improved manufacturing yield.

Whereas in the above described Embodiment 3, Embodiment 4, and Embodiment 5, the voltage value (+2V) and the pulse width (100 nsec) of the storing voltage VWRITE and the voltage value (−2V) and the pulse width (100 nsec) of the reset voltage VRESET are illustrated, other voltage values and pulse widths may be used so long as desired pulse voltage conditions are met in order to change the resistance state of the memory element.

Figure 28:
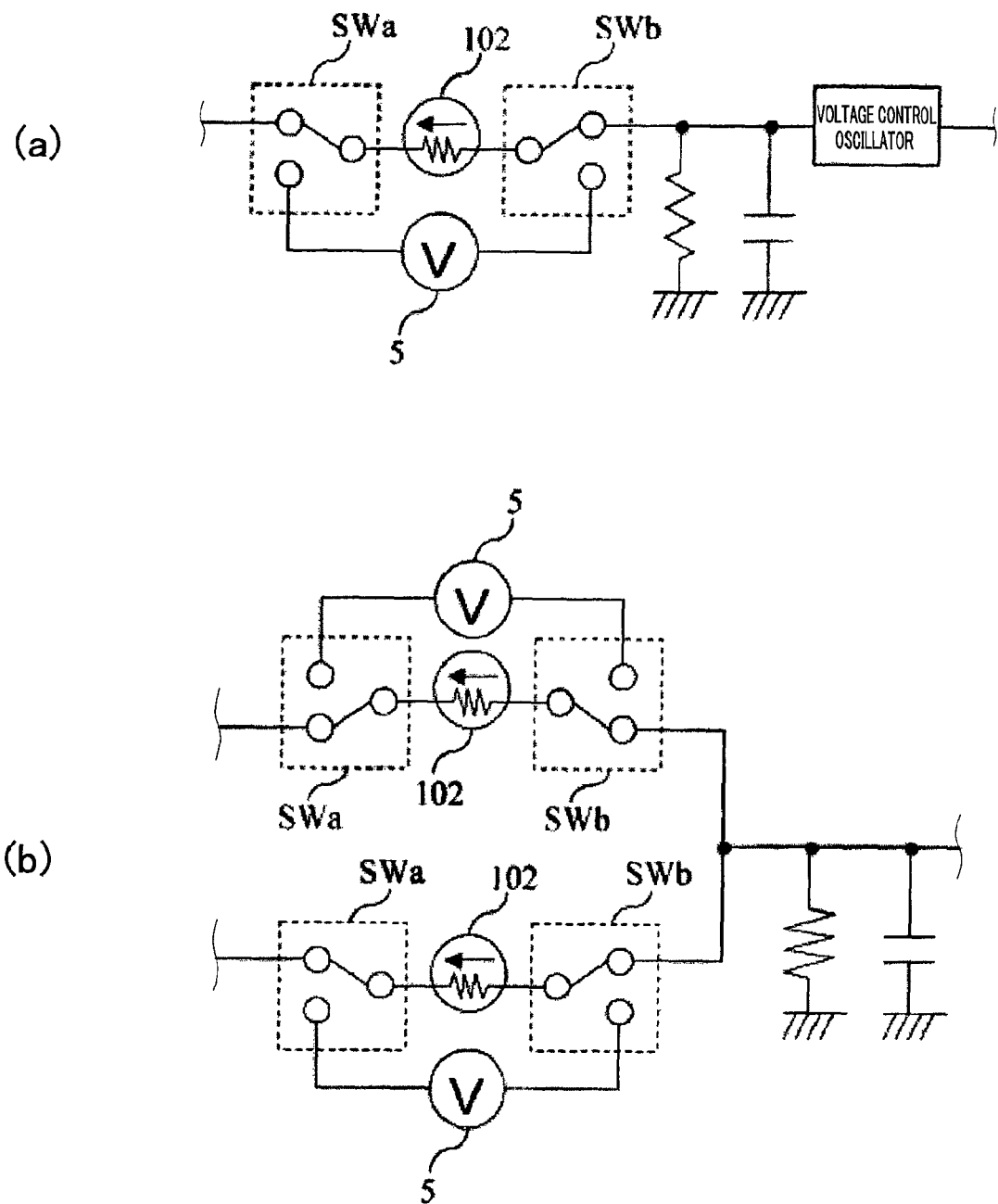
FIG. 28 is a block diagram showing another example of a use of a resistance variable memory element configured as in the memory element described in Embodiment 1.

Whereas in the above described Embodiment 3, Embodiment 4, and Embodiment 5, the resistance variable memory element described in Embodiment 1 is used as the "memory element," the use is not limited to this. For example, in other uses of the memory element (A) described in Embodiment 1, the memory element (A) described in Embodiment 1 can be used as a switching element for determining switching between a plurality of signals, a resistance variable element used for switching a frequency, a resistance variable element for determining a mixing ratio between a plurality of signals or a time constant variable element for determining a time constant by combination with a capacitor. FIG. 28 is a block diagram showing an example of another use of the resistance variable element configured as in the memory element described in Embodiment 1. FIG. 28(a) is a block diagram showing a configuration of a frequency variable circuit using the resistance variable element, and FIG. 28(b) is a block diagram showing a configuration of a mixing circuit using the resistance variable element. In FIG. 28, the configuration and operation of elements other than a resistance variable element 102, and an electric power supply 5 and switches SWa and SWb connected to the resistance variable element 102 will not be described.

In a case where the resistance value of the resistance variable element 102 is varied in the configuration shown in FIGS. 28(a) and 28(b), the switches SWa and SWb are switched to electrically connect the resistance variable element 102 to the electric power supply 5. Then, a predetermined pulse voltage is applied from the electric power supply 5 to the resistance variable element 102, causing the resistance value of the resistance variable element 102 to vary. By returning the switches SWA and SWb to their initial connection states, the resistance value of the resistance variable element 102 can be easily altered. By using the resistance variable memory 102 having such a configuration, the frequency variable circuit shown in FIG. 28(a) or the mixing circuit for changing a mixing ratio between two signals shown in FIG. 28(b) can be configured.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

A memory element of the present invention is capable of reducing a defective rate due to generation of inconstant resistance values so that the memory element can be manufactured with a high yield. In addition, since the memory element is capable of high-speed operation, it can be used as a resistance variable element such as a nonvolatile memory.

The invention claimed is:

1. A memory element comprising:
a first electrode;
a second electrode; and
a resistance variable film which is disposed between the first and second electrodes to be connected to the first and second electrodes, a resistance value of the resistance variable film varying based on a voltage applied between the first and second electrodes,
wherein the resistance variable film includes a layer made of $Fe_3O_4$ and a layer made of $Fe_2O_3$ or a spinel structure oxide which is expressed as $MFe_2O_4$ (M: metal element except for Fe), and
wherein the layer made of $Fe_3O_4$ is thicker than the layer made of $Fe_2O_3$ or the spinel structure oxide.

2. The nonvolatile memory element according to claim 1, wherein the layer made of $Fe_2O_3$ or the spinel structure oxide is formed at least either in the vicinity of an interface between the resistance variable film and the first electrode or in the vicinity of an interface between the resistance variable film and the second electrode.

3. The memory element according to claim 1, wherein the resistance variable film has a thickness that is not smaller than 1 nm and not larger than 200 nm.

4. The memory element according to claim 1, wherein the layer made of $Fe_2O_3$ or the spinel structure oxide has a thickness that is not larger than 20% of a thickness of the resistance variable film.

5. The memory element according to claim 1, wherein M of the spinel structure oxide is at least one element selected from a group consisting of Mn, Co, Ni, Cu, and Zn.

6. The memory element according to claim 1, wherein at least one of the first and second electrodes is made of a material selected from a group consisting of Ag, Au, Pt, Ru, $RuO_2$, Ir, $IrO_2$, TiO, TiN, and TiAlN.

7. The memory element according to claim 1, wherein a predetermined pulse voltage is applied between the first electrode and the second electrode to cause 1-bit or multi-bit data to be stored therein according to a variation in the resistance value.

8. The memory element according to claim 1, wherein a predetermined voltage is applied between the first electrode and the second electrode to cause 1-bit or multi-bit data to be reproduced so as to correspond to a current value according to a variation in the resistance value.

9. A memory element comprising:
a memory array including:
a semiconductor substrate;
a plurality of first electrode wires formed on the semiconductor substrate to extend in parallel with each other;
a plurality of second electrode wires formed above the plurality of first electrode wires so as to extend in parallel with each other within a plane parallel to a main surface of the semiconductor substrate and so as to three-dimensionally cross the plurality of first electrode wires; and
nonvolatile memory elements provided to respectively correspond to three-dimensional cross points between the plurality of first electrode wires and the plurality of second electrode wires, wherein:
each of the nonvolatile memory elements includes a resistance variable film which is disposed between the first and second electrode wires, a resistance value of the resistance variable film varying based on a voltage applied between the first and second electrode wires;
the resistance variable film includes a layer made of $Fe_3O_4$ and a layer made of $Fe_2O_3$ or a spinel structure oxide which is expressed as $MFe_2O_4$ (M: metal element except for Fe), and
the layer made of $Fe_3O_4$ is thicker than the layer made of $Fe_2O_3$ or the spinel structure oxide.

10. The nonvolatile memory element according to claim 9, wherein the layer made of $Fe_2O_3$ or the spinel structure oxide is formed at least either in the vicinity of an interface between the resistance variable film and the first electrode wire or in the vicinity of an interface between the resistance variable film and the second electrode wire.

11. The memory element according to claim 9, wherein the resistance variable film has a thickness that is not smaller than 1 nm and not larger than 200 nm.

12. The memory element according to claim 9, wherein the layer made of $Fe_2O_3$ or the spinel structure oxide has a thickness that is not larger than 20% of a thickness of the resistance variable film.

13. The memory element according to claim 9, wherein M of the spinel structure oxide is at least one element selected from a group consisting of Mn, Co, Ni, Cu, and Zn.

14. The memory element according to claim 9, wherein at least one of the first and second electrode wires is made of a material selected from a group consisting of Ag, Au, Pt, Ru, $RuO_2$, Ir, $IrO_2$, TiO, TiN, and TiAlN.

15. The memory element according to claim 9, wherein a predetermined pulse voltage is applied between the first electrode wire and the second electrode wire to cause 1-bit or multi-bit data to be stored therein according to a variation in the resistance value.

16. The memory element according to claim 9, wherein a predetermined voltage is applied between the first electrode wire and the second electrode wire to cause 1-bit or multi-bit data to be reproduced so as to correspond to a current value according to a variation in the resistance value.

17. A memory apparatus comprising:
a plurality of word lines extending in a first direction;
a plurality of bit lines extending in a second direction so as to cross the word lines;
a plurality of plate lines extending in the second direction so as to respectively correspond to the plurality of bit lines;
a plurality of transistors provided to respectively correspond to intersections between the word lines and the bit lines;
a plurality of memory elements respectively corresponding to the plurality of transistors;
a word line driving portion which is connected to the plurality of word lines and is configured to control voltage application to the word lines; and
a bit line/plate line driving portion which is connected to the plurality of bit lines and to the plurality of plate lines and is configured to control voltage application to the bit lines and to the plate lines, wherein one of the plurality of transistors and one of the plurality of memory elements which is associated with the one of the plurality of transistors are connected in series between one of the plurality of bit lines and one of the plurality of plate lines which is associated with the one of the plurality of bit lines, wherein a gate of the one of the plurality of transistors is connected to one of the plurality of word lines and a drain and source of the one of the plurality of transistors is connected to the one of the bit lines and to the one of the memory elements, wherein the one of the memory elements includes a first electrode connected to the one of the plurality of transistors, a second electrode connected to the one of the plate lines, and a resistance variable film connected to the first electrode and to the second electrode, wherein the resistance variable film includes a layer made of $Fe_3O_4$ and a layer made of $Fe_2O_3$ or a spinel structure oxide which is expressed as $MFe_2O_4$ (M: metal element except for Fe), and wherein the layer made of $Fe_3O_4$ is thicker than the layer made of $Fe_2O_3$ or the spinel structure oxide.

18. The memory apparatus according to claim 17,
wherein the word line driving portion is configured to apply an activation voltage to a word line connected to the gate of the transistor associated with the memory element in which predetermined data is to be stored to cause a drain-source of the transistor to be placed in an electrically conductive state, and wherein the bit line/plate line driving portion is configured to apply a first pulse voltage to a bit line connected to the transistor associated with the memory element in which the predetermined data is to be stored and to apply a second pulse voltage to a plate line associated with the bit line.

19. The memory apparatus according to claim 17,
wherein the word line driving portion is configured to apply an activation voltage to a word line connected to the gate of the transistor associated with the memory element from which prestored predetermined data is to be reproduced to cause a drain-source of the transistor to be placed in an electrically conductive state, and wherein the bit line/plate line driving portion is configured to apply a first reproducing voltage to a bit line connected to the transistor associated with the memory element from which the predetermined data is to be reproduced and to apply a second reproducing voltage to a plate line associated with the bit line.

20. A semiconductor integrated circuit comprising:
a memory apparatus according to claim 17; and
a logic circuit having a storing mode and a reproducing mode and being configured to execute predetermined calculation, wherein the logic circuit is configured to, in the storing mode, control the memory apparatus to cause the memory apparatus to store bit data therein, and is configured to, in the reproducing mode, control the memory apparatus to cause the memory apparatus to reproduce the bit data stored therein.

21. A semiconductor integrated circuit comprising:
a a memory apparatus according to claim 17; and
a processor having a program running mode and a program rewrite mode, wherein the processor is configured to, in the program running mode, run a program stored in the memory apparatus, and is configured to, in the program rewrite mode, rewrite the program stored in the memory apparatus to a program input externally.

* * * * *

UNITED STATES PATENT AND TRADEMARK OFFICE
CERTIFICATE OF CORRECTION

| | | |
|---|---|---|
| PATENT NO. | : 7,964,869 B2 | |
| APPLICATION NO. | : 12/376256 | |
| DATED | : June 21, 2011 | |
| INVENTOR(S) | : Shunsaku Muraoka et al. | |

It is certified that error appears in the above-identified patent and that said Letters Patent is hereby corrected as shown below:

Column 36, Line 26 (Claim 21) -- a a memory apparatus should appear as -- a memory apparatus --

Signed and Sealed this
Fifteenth Day of November, 2011

David J. Kappos
*Director of the United States Patent and Trademark Office*